(12) United States Patent
Ooishi

(10) Patent No.: US 7,072,207 B2
(45) Date of Patent: Jul. 4, 2006

(54) THIN FILM MAGNETIC MEMORY DEVICE FOR WRITING DATA OF A PLURALITY OF BITS IN PARALLEL

(75) Inventor: Tsukasa Ooishi, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 120 days.

(21) Appl. No.: 10/777,069

(22) Filed: Feb. 13, 2004

(65) Prior Publication Data

US 2004/0160822 A1 Aug. 19, 2004

Related U.S. Application Data

(62) Division of application No. 10/170,580, filed on Jun. 14, 2002, now Pat. No. 6,714,443.

(30) Foreign Application Priority Data

Dec. 21, 2001 (JP) ............................. 2001-389058

(51) Int. Cl.
*G11C 11/14* (2006.01)
*G11C 11/00* (2006.01)
*G11C 5/08* (2006.01)
*G11C 8/00* (2006.01)
*G11C 8/02* (2006.01)

(52) U.S. Cl. .................. 365/171; 365/66; 365/158; 365/173; 365/230.03; 365/230.06; 365/230.07; 365/232

(58) Field of Classification Search ................ 365/158, 365/171, 172, 173, 230.03, 230.06, 230.07, 365/231, 66, 232
See application file for complete search history.

(56) References Cited

U.S. PATENT DOCUMENTS 3,271,741 A * 9/1966 Bates .................... 365/230.04

(Continued)

FOREIGN PATENT DOCUMENTS

| DE | 197 26 077 A1 | 1/1998 |
|---|---|---|
| DE | 197 26 852 A1 | 2/1998 |
| DE | 101 33 646 A1 | 4/2002 |
| DE | 101 23 332 | 11/2002 |
| EP | 0 507 451 A2 | 10/1992 |
| JP | 10-106255 | 4/1998 |
| JP | 10-106255 A | 4/1998 |

OTHER PUBLICATIONS

"A 10ns Read and Write Non-Volatile Memory Array Using a Magnetic Tunnel Junction and FET Switch in Each Cell", Scheuerlein et al., ISSCC Digest of Technical Papers, TA7.2, Feb. 2000, pp. 94-95, 128-129, 409-410.

(Continued)

*Primary Examiner*—Amir Zarabian
*Assistant Examiner*—Ly Duy Pham
(74) *Attorney, Agent, or Firm*—McDermott Will & Emery LLP

(57) ABSTRACT

For writing K-bit write data in parallel (K is integer at least 2), bit lines each arranged for each memory cell columns and at least K current return lines are provided. K selected bit lines to write the K-bit write data are connected in series in a single current path. When data having different levels are written through adjacent selected bit lines, the selected bit lines are connected to each other at their one ends or the other ends, so that a bit line write current flowing through the former selected bit line is directly transmitted to the latter selected bit line. On the other hand, when data having the same level are written through adjacent selected bit lines, a bit line write current flowing through the former selected bit line is turned back by the corresponding current return line, and then transmitted to the latter selected bit line.

1 Claim, 18 Drawing Sheets

U.S. PATENT DOCUMENTS

| | | | |
|---|---|---|---|
| 5,448,515 A | 9/1995 | Fukami et al. | |
| 5,732,016 A | 3/1998 | Chen et al. | |
| 5,734,606 A | 3/1998 | Tehrani et al. | |
| 5,894,447 A | 4/1999 | Takashima | |
| 5,920,500 A | 7/1999 | Tehrani et al. | |
| 5,946,227 A | 8/1999 | Naji | |
| 6,055,178 A * | 4/2000 | Naji | 365/158 |
| 6,418,046 B1 * | 7/2002 | Naji | 365/158 |
| 6,587,371 B1 * | 7/2003 | Hidaka | 365/173 |
| 6,608,776 B1 | 8/2003 | Hidaka | |
| 6,611,454 B1 * | 8/2003 | Hidaka | 365/171 |
| 6,741,513 B1 * | 5/2004 | Honigschmid et al. | 365/158 |
| 6,778,430 B1 | 8/2004 | Hidaka | |
| 6,876,575 B1 * | 4/2005 | Hidaka | 365/171 |
| 2002/0057593 A1 * | 5/2002 | Hidaka | 365/171 |
| 2003/0117838 A1 * | 6/2003 | Hidaka | 365/171 |
| 2003/0156448 A1 * | 8/2003 | Hidaka | 365/171 |
| 2003/0161180 A1 * | 8/2003 | Bloomquist et al. | 365/173 |
| 2003/0198080 A1 * | 10/2003 | Iwata | 365/158 |
| 2004/0047196 A1 | 3/2004 | Hidaka | |

OTHER PUBLICATIONS

"Nonvolatile RAM based on Magnetic Tunnel Junction Elements", Durlam et al., ISSCC Digest of Technical Papers, TA7.3, Feb. 2000, pp. 96-97, 130-131, 410-411.

Durlam, M. et al., "Nonvolatile RAM based on magnetic tunnel junction elements" IEEE International Solid-State Circuits Conference, Feb. 7-9, 2000, pp. 130-131.

Scheuerlein, R. et al., "A 10ns read and write nonvolatile memory array using a magnetic tunnel junction and FET switch in each cell" IEEE International Solid-State Circuits Conference, Feb. 7-9, 2000, pp. 128-129.

* cited by examiner

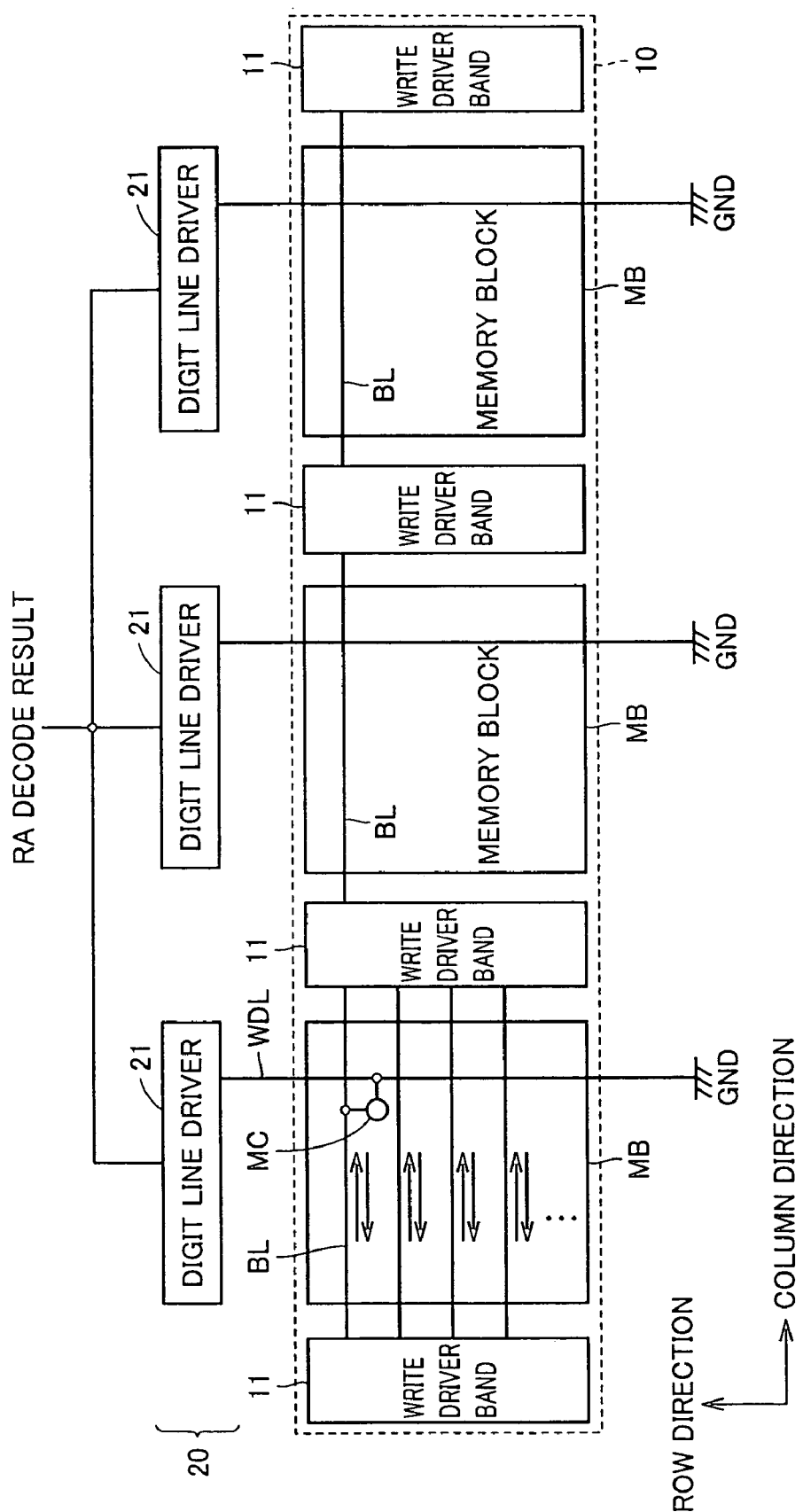

OPERATION OF WRITING DIFFERENT DATA THROUGH ADJACENT BLs

OPERATION OF WRITING SAME DATA THROUGH ADJACENT BLs

THIN FILM MAGNETIC MEMORY DEVICE FOR WRITING DATA OF A PLURALITY OF BITS IN PARALLEL

This application is a division of application Ser. No. 10/170,580, filed Jun. 14, 2002, now U.S. Pat. No. 6,714,443.

BACKGROUND OF THE INVENTION

1. Field of the Invention

The present invention generally relates to a thin film magnetic memory device. More particularly, the present invention relates to a random access memory (RAM) including memory cells having a magnetic tunnel junction (MTJ).

2. Description of the Background Art

An MRAM (Magnetic Random Access Memory) device has attracted attention as a memory device capable of non-volatile data storage with low power consumption. The MRAM device is a memory device capable of non-volatile data storage using a plurality of thin film magnetic elements formed in a semiconductor integrated circuit and also capable of random access to each thin film magnetic element as a memory cell.

In particular, recent announcement shows that the use of thin film magnetic elements having a magnetic tunnel junction (MTJ) as memory cells significantly improves performance of the MRAM device. The MRAM device including memory cells having a magnetic tunnel junction is disclosed in technical documents such as "A 10 ns Read and Write Non-Volatile Memory Array Using a Magnetic Tunnel Junction and FET Switch in each Cell", ISSCC Digest of Technical Papers, TA7.2, February 2000, and "Nonvolatile RAM based on Magnetic Tunnel Junction Elements", ISSCC Digest of Technical Papers, TA7.3, February. 2000.

FIG. 16 schematically shows the structure of a memory cell having a magnetic tunnel junction (hereinafter, sometimes simply referred to as "MTJ memory cell").

Referring to FIG. 16, the MTJ memory cell includes a tunneling magneto-resistance element TMR having an electric resistance varying according to a magnetically written storage data level, and an access element ATR. Access transistor ATR is connected in series with tunneling magneto-resistance element TMR between a bit line BL and a source line SRL. A field effect transistor formed on a semiconductor substrate is typically used as access transistor ATR.

A bit line BL, a write digit line WDL, a word line WL and a source line SRL are provided for the MTJ memory cell. Bit line BL and write digit line WDL pass data write currents of different directions therethrough in data write operation, respectively. Word line WL is used to conduct data read operation. Source line SRL pulls tunneling magneto-resistance element TMR down to a ground voltage GND in data read operation. In data read operation, tunneling magneto-resistance element TMR is electrically coupled between source line SRL (ground voltage GND) and bit line BL in response to turning-ON of access transistor ATR.

FIG. 17 is a conceptual diagram illustrating data write operation to the MTJ memory cell.

Referring to FIG. 17, tunneling magneto-resistance element TMR has a ferromagnetic material layer FL having a fixed magnetization direction (hereinafter, sometimes simply referred to as "fixed magnetic layer"), and a ferromagnetic material layer VL that is magnetized in the direction according to an external magnetic field (hereinafter, sometimes simply referred to as "free magnetic layer"). A tunneling barrier (tunneling film) TB of an insulator film is interposed between fixed magnetic layer FL and free magnetic layer VL. Free magnetic layer VL is magnetized either in the same (parallel) direction as, or in the opposite direction to, that of fixed magnetic layer FL according to the write data level. Fixed magnetic layer FL, tunneling barrier TB and free magnetic layer VL form a magnetic tunnel junction.

The electric resistance of tunneling magneto-resistance element TMR varies according to the relation between the respective magnetization directions of fixed magnetic layer FL and free magnetic layer VL. More specifically, the electric resistance of tunneling magneto-resistance element TMR is minimized (Rmin) when fixed magnetic layer FL and free magnetic layer VL have parallel magnetization directions, and is maximized (Rmax) when they have opposite (antiparallel) magnetization directions.

In data write operation, word line WL is inactivated and access transistor ATR is turned OFF. In this state, a data write current for magnetizing free magnetic layer VL is applied to each of bit line BL and write digit line WDL in the direction according to the write data level.

FIG. 18 is a conceptual diagram illustrating the relation between the data write current and the magnetization direction of the tunneling magneto-resistance element in data write operation.

Referring to FIG. 18, the abscissa H(EA) indicates a magnetic field that is applied to free magnetic layer VL of tunneling magneto-resistance element TMR in the easy-axis (EA) direction. The ordinate H(HA) indicates a magnetic field that is applied to free magnetic layer VL in the hard-axis (HA) direction. Magnetic fields H(EA), H(HA) respectively correspond to two magnetic fields produced by the currents flowing through bit line BL and write digit line WDL.

In the MTJ memory cell, fixed magnetic layer FL is magnetized in the fixed direction along the easy axis of free magnetic layer VL. Free magnetic layer VL is magnetized either in the direction parallel or antiparallel (opposite) to that of fixed magnetic layer FL along the easy axis according to the storage data level ("1" and "0"). The MTJ memory cell is thus capable of storing 1-bit data ("1" and "0") according to the two magnetization directions of free magnetic layer VL.

The magnetization direction of free magnetic layer VL can be rewritten only when the sum of the applied magnetic fields H(EA) and H(HA) reaches the region outside the asteroid characteristic line shown in the FIG. 18. In other words, the magnetization direction of free magnetic layer VL will not switch if an applied data write magnetic field corresponds to the region inside the asteroid characteristic line.

As shown by the asteroid characteristic line, applying a magnetic field of the hard-axis direction to free magnetic layer VL enables reduction in a magnetization threshold value required to change the magnetization direction along the easy axis.

When the operation point of the data write operation is designed as in the example of FIG. 18, a data write magnetic field of the easy-axis direction is designed to have strength $H_{WR}$ in the MTJ memory cell to be written. In other words, the data write current to be applied to bit line BL or write digit line WDL is designed to produce such a data write magnetic field $H_{WR}$. In general, data write magnetic field $H_{WR}$ is defined by the sum of a switching magnetic field $H_{SW}$ required to switch the magnetization direction and a margin $\Delta H$. Data write magnetic field $H_{WR}$ is thus defined by $H_{WR}=H_{SW}+\Delta H$.

In order to rewrite the storage data of the MTJ memory cell, that is, the magnetization direction of tunneling magneto-resistance element TMR, a data write current of at least a prescribed level must be applied to both write digit line WDL and bit line BL. Free magnetic layer VL in tunneling magneto-resistance element TMR is thus magnetized in the direction parallel or opposite (antiparallel) to that of fixed magnetic layer FL according to the direction of the data write magnetic field along the easy axis (EA). The magnetization direction written to tunneling magneto-resistance element TMR, i.e., the storage data of the MTJ memory cell, is held in a non-volatile manner until another data write operation is conducted.

FIG. 19 is a conceptual diagram illustrating data read operation from the MTJ memory cell.

Referring to FIG. 19, in data read operation, access transistor ATR is turned ON in response to activation of word line WL. As a result, tunneling magneto-resistance element TMR pulled down to ground voltage GND is electrically coupled to bit line BL.

If bit line BL is then pulled up to a prescribed voltage, a memory cell current Icell according to the electric resistance of tunneling magneto-resistance element TMR, that is, the storage data level of the MTJ memory cell, flows through a current path including bit line BL and tunneling magneto-resistance element TMR. For example, the storage data can be read from the MTJ memory cell based on comparison between memory cell current Icell and a prescribed reference current.

The electric resistance of tunneling magneto-resistance element TMR thus varies according to the magnetization direction that is rewritable by an applied data write magnetic field. Accordingly, non-volatile data storage can be realized by using electric resistances Rmax and Rmin of tunneling magneto-resistance element TMR as the respective storage data levels ("1" and "0").

FIG. 20 shows the structure of the MTJ memory cell formed on a semiconductor substrate.

Referring to FIG. 20, access transistor ATR formed on a semiconductor main substrate SUB has source/drain regions (n-type regions) 510, 520 and a gate 530. Source/drain region 510 is electrically coupled to source line SRL through a metal film formed in a contact hole 541.

Write digit line WDL is formed in a metal wiring layer above source line SRL. Tunneling magneto-resistance element TMR is formed in a layer above write digit line WDL. Tunneling magneto-resistance element TMR is electrically coupled to source/drain region 520 of access transistor ATR through a strap SL and a metal film formed in a contact hole 540. Strap SL is formed from an electrically conductive material, and electrically couples tunneling magneto-resistance element TMR to access transistor ATR.

Bit line BL is electrically coupled to tunneling magneto-resistance element TMR, and is formed in a layer on tunneling magneto-resistance element TMR. As described before, in data write operation, a data write current must be supplied to both bit line BL and write digit line WDL. In data read operation, however, access transistor ATR is turned ON in response to activation of word line WL to, e.g., a high voltage state. As a result, tunneling magneto-resistance element TMR pulled down to ground voltage GND through access transistor ATR is electrically coupled to bit line BL.

In data write operation of the MRAM device, a data write current must be supplied to both write digit line WDL and bit line BL corresponding to the selected memory cell. These data write currents are required to generate a data write magnetic field having at least a prescribed strength in tunneling magneto-resistance element TMR of the selected memory cell. Therefore, an applied data write current must be generally on the order of several milliamperes (mA).

Meanwhile, increased data processing capacity and data processing speed are required in applications of the semiconductor memory device. In other words, a so-called multi-bit semiconductor memory device is required which is capable of receiving and outputting data of a plurality of bits in parallel in each data read operation and data write operation.

Using the above MRAM device as such a multi-bit semiconductor memory device would significantly increase current consumption in data write operation.

Moreover, a magnetic field having the direction according to a write data level must be generated for the selected memory cell along the easy axis (EA) of tunneling magneto-resistance element TMR. In other words, write drivers for controlling the direction of the data write current according to the write data level must be provided for either bit lines BL or write digit lines WDL. Such a write driver must be provided in each memory cell column or each memory cell row. When the write drivers have a complex structure, it is difficult to reduce the area of the MRAM device.

SUMMARY OF THE INVENTION

It is an object of the present invention to provide an MRAM device having a multi-bit structure with low current consumption.

It is another object of the present invention to provide an MRAM device including write drivers with simple structures.

In summary, according to one aspect of the present invention, a thin film magnetic memory device for writing K-bit write data in parallel (where K is an integer of at least 2) includes a plurality of memory cells, a plurality of write digit lines, a plurality of bit lines, at least K current return lines and a write driver. The plurality of memory cells are arranged in a matrix. Each memory cell has an electric resistance according to storage data magnetically written therein. The plurality of write digit lines are arranged respectively corresponding to the memory cell rows, for passing therethrough a prescribed write current of a fixed direction in a selected row in data write operation. The plurality of bit lines are arranged respectively corresponding to the memory cell columns, for passing therethrough a data write current of a direction according to a level of the write data. The plurality of current return lines are arranged respectively corresponding to the memory cell columns. Each current return line turns back the data write current flowing through one of K selected bit lines of K columns selected to write the K-bit write data as necessary. The write driver supplies the data write current to the K selected bit lines in directions respectively corresponding to the K-bit write data. The write driver connects the K selected bit lines and L of the current return lines in series between first and second voltages in the data write operation (where L is an integer in a range of 0 to K).

In the above thin film magnetic memory device, a bit line write current can be supplied to the selected bit lines in the directions respectively corresponding to a plurality of bits of write data. This enables the data of the plurality of bits to be written in parallel without increasing current consumption.

According to another aspect of the present invention, a thin film magnetic memory device includes a memory array, a plurality of write digit lines, first and second write current control lines, a first connection control portion, a second connection control portion, a plurality of column selection lines, and write drivers. The memory array has a plurality of memory cells arranged in a matrix. Each memory cell has an electric resistance that varies according to storage data magnetically written therein. The plurality of write digit lines are arranged respectively corresponding to the plurality of memory cell rows, for passing therethrough a prescribed current of a fixed direction in a selected row in data write operation. The plurality of bit lines are arranged respectively corresponding to the plurality of memory cell columns for passing therethrough a data write current of a direction corresponding to a level of write data in a selected column in the data write operation. The first and second write current control lines are respectively provided at both ends of the plurality of bit lines so as to extend in a direction along the memory cell rows, and shared by the plurality of bit lines. The first connection control portion connects one of the first and second write current control lines to a first voltage in the data write operation. The second connection control portion connects the other write current control line to a second voltage in the data write operation. The plurality of column selection lines are arranged respectively corresponding to the plurality of memory cell columns, and activated in a selected column. The write drivers are provided respectively corresponding to the memory cell columns. Each write driver connects a corresponding one of the bit lines between the first and second write current control lines in response to activation of a corresponding one of the plurality of column selection lines.

In the above thin film magnetic memory device, a data write current is supplied to the selected bit lines through the write current control lines shared by the plurality of memory cell columns. As a result, the structure of the write drivers provided corresponding to the respective bit lines can be simplified, enabling reduction in area of the MRAM device.

According to a further aspect of the present invention, a thin film magnetic memory device includes a memory array, a plurality of write digit lines, a plurality of bit lines, a plurality of column selection lines, and a plurality of write drivers. The memory array has a plurality of memory cells arranged in a matrix. Each memory cell has an electric resistance that varies according to storage data magnetically written therein. The memory array is divided into a plurality of memory blocks along a direction of the memory cell rows. The plurality of write digit lines are arranged respectively corresponding to the plurality of memory cell rows, for passing therethrough a prescribed write current of a fixed direction in a selected row in data write operation. The plurality of bit lines are arranged respectively corresponding to the plurality of memory cell columns. In each memory cell column, the bit line is divided by the plurality of memory blocks. The plurality of column selection lines are arranged respectively corresponding to the plurality of memory cell columns, for transmitting a column selection result. Each column selection line is shared by the plurality of memory blocks. The plurality of write drivers are provided respectively corresponding to the plurality of bit lines. Each write driver operates in response to activation of a corresponding one of the plurality of column selection lines to supply a data write current of a direction corresponding to a level of write data to a corresponding one of the plurality of bit lines.

In the above thin film magnetic memory device, the memory array is divided into a plurality of memory blocks in the row direction, and the column selection result can be transmitted to each memory block without increasing the number of signal lines. This enables the capacity of the memory array to be increased efficiently.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a block diagram showing the structure of a memory array in FIG. 1.

DESCRIPTION OF THE PREFERRED EMBODIMENTS

Figure 1:
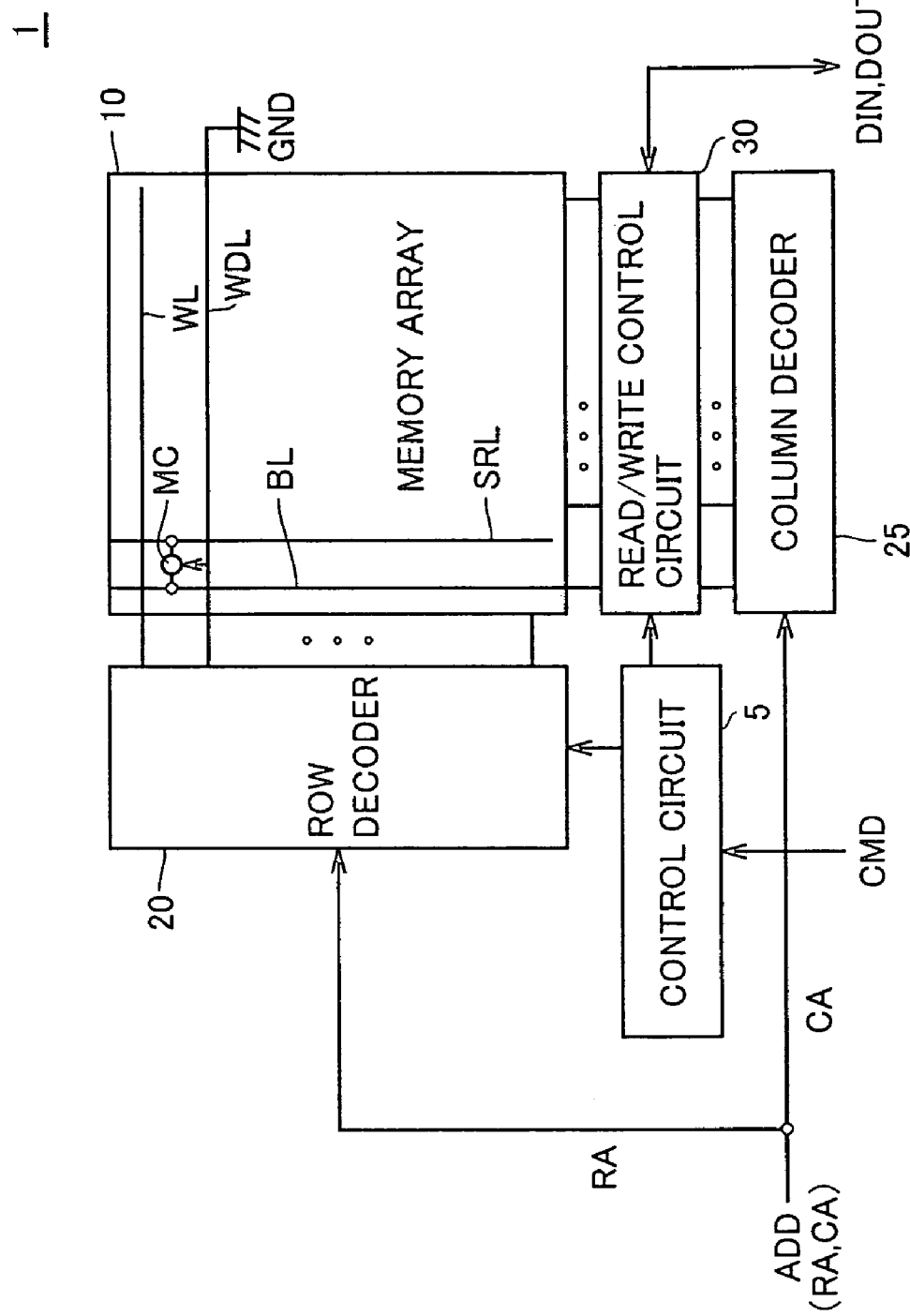
FIG. 1 is a schematic block diagram showing the overall structure of an MRAM device according to an embodiment of the present invention.

Hereinafter, embodiments of the present invention will be described with reference to the accompanying drawings. The same or corresponding portions are denoted with the same reference numerals and characters throughout the figures.

First Embodiment

Referring to FIG. 1, an MRAM device 1 according to an embodiment of the present invention conducts random access in response to an external control signal CMD and an external address signal ADD in order to receive write data DIN and output read data DOUT.

MRAM device 1 includes a control circuit 5 for controlling the overall operation of MRAM device 1 in response to control signal CMD, and a memory array 10 having MTJ memory cells MC arranged in a matrix.

In memory array 10, word lines WL and write digit lines WDL are arranged corresponding to the respective MTJ memory cell rows, and bit lines BL and source lines SRL are arranged corresponding to the respective MTJ memory cell columns. FIG. 1 exemplarily shows a single MTJ memory cell MC, and a corresponding word line WL, write digit line WDL, bit line BL and source line SRL.

MRAM device 1 further includes a row decoder 20, a column decoder 25 and a read/write control circuit 30. Row decoder 20 decodes a row address RA of an address signal ADD and selects a row in memory array 10. Column decoder 25 decodes a column address CA of address signal ADD and selects a column in memory array 10.

Read/write control circuit 30 collectively refers to the circuitry including a circuit for supplying a data write current to bit line BL according to write data DIN in data write operation, a circuit for supplying a data read current to bit line BL in data read operation, and a circuit for producing read data DOUT in data read operation.

Write digit lines WDL are coupled to a ground voltage GND in a region facing row decoder 20 with memory array 10 interposed therebetween.

Referring to FIG. 2, according to the first embodiment, memory array 10 is divided along the row direction into a plurality of memory blocks MB.

Row decoder 20 includes a plurality of digit line drivers 21 corresponding to the respective memory blocks MB. Each digit line driver 21 controls activation of write digit line WDL in a corresponding memory block MB according to the decode result of row address RA by a not-shown decode circuit. More specifically, each digit line driver 21 couples write digit line WDL of the selected row to a power supply voltage Vcc.

Write digit line WDL thus activated is connected to power supply voltage Vcc and ground voltage GND at both ends thereof, respectively. This allows a data write current Ip of the row direction to be supplied to the activated write digit line WDL. Data write current Ip of the row direction has the same direction regardless of the write data level.

Each digit line driver 21 fixes non-selected write digit lines WDL to ground voltage GND. Accordingly, data write current Ip of the row direction will not flow through the non-selected write digit lines WDL.

Bit lines BL corresponding to the respective memory cell columns are divided by memory blocks MB. Bit lines BL in each memory block MB are thus independent of those in other memory blocks MB. In each memory block MB, supply of a data write current to bit line BL is controlled by write drivers in corresponding write driver bands 11. Write driver band 11 is provided in each of the regions between adjacent memory blocks and the regions outside the memory blocks located at both ends.

According to the first embodiment, one of memory blocks MB is selected. In the selected memory block MB, a single write digit line WDL is activated and K bit lines BL (where K is an integer equal to or larger than 2) are selected simultaneously. By connecting the selected K bit lines BL in series with each other, K-bit data can be written in parallel without increasing a data write current flowing through the bit lines (hereinafter, sometimes referred to as "bit line write current"). Such an array structure will now be described.

Figure 3A:
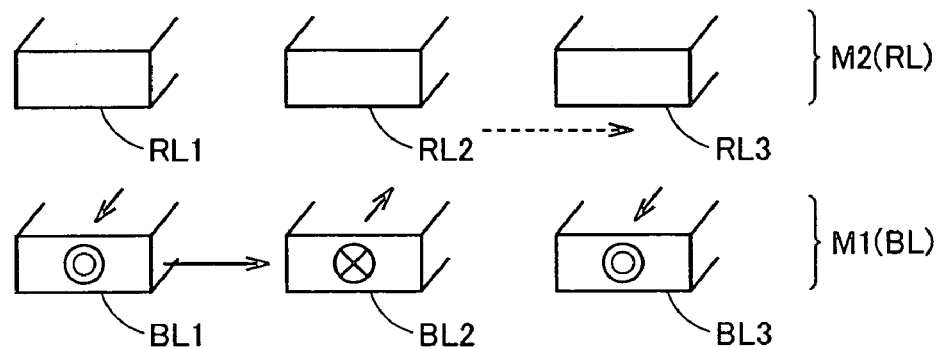
FIGS. 3A and 3B are conceptual diagrams illustrating supply of a bit line write current according to a first embodiment of the present invention.
Figure 3B:
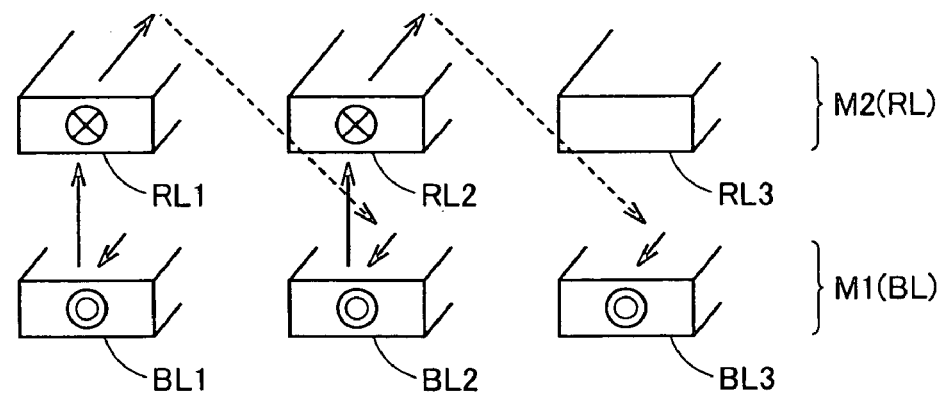

FIGS. 3A and 3B illustrate a method for supplying a bit line write current for K=3, that is, when three bit lines are simultaneously selected to write 3-bit data in parallel.

According to the first embodiment, bit lines BL corresponding to the respective memory cell columns and current return lines RL are arranged. Bit lines BL are formed in a metal wiring layer M1, and current return lines RL are formed in another metal wiring layer M2. Forming bit lines BL and current return lines RL in different metal wiring layers avoids an excessively increased wiring pitch in a specific metal wiring layer. Current return lines RL should be arranged, one for each of the selected K bit lines, i.e., at least K in number. Alternatively current return lines RL can be arranged corresponding to the memory cell columns, respectively.

FIGS. 3A and 3B show bit lines BL1 to BL3 of the selected three (K=3) memory cell columns, and corresponding current return lines RL1 to RL3. As described before, a bit line write current flowing through each of selected bit lines BL1 to BL3 is required to have a direction according to a corresponding bit of the write data (3 bits).

FIG. 3A illustrates a method for supplying a bit line write current in order to write data of different levels through adjacent selected bit lines. In the example of FIG. 3A, data "0" is written to selected bit lines BL1 and BL3, and data "1" is written to selected bit line BL2. In other words, a bit line write current −Iw for writing data "0" is supplied to selected bit lines BL1, BL3, and a bit line write current +Iw for writing data "1" is supplied to selected bit line BL2.

In this case, by connecting adjacent selected bit lines at their one ends or the other ends, a bit line write current for writing desired data can be supplied to a single current path. For example, as shown in FIG. 3A, selected bit lines BL1, BL2 are electrically coupled together at their one ends (i.e., the ends located on the front side in the figure), and selected bit lines BL2 and BL3 are electrically coupled together at the other ends (i.e., the ends located on the back side in the figure).

As a result, the data of a plurality of bits (3 bits) can be written through the series-connected selected bit lines BL1 to BL3 by using a bit line write current that corresponds a current required to write one bit in the conventional MRAM device.

FIG. 3B illustrates a method for supplying a bit line write current in order to write data of the same level through adjacent selected bit lines. For example, in the example of FIG. 3B, data "0" is written through each of selected bit lines BL1 to BL3. In other words, a bit line write current −Iw for writing data "0" is supplied to each of selected bit lines BL1 to BL3. In this case, it is necessary to supply a current of the same direction to adjacent selected bit lines. However, it is impossible to supply a current of a desired direction even if the selected bit lines are coupled together.

The following method is possible in order to transmit a bit line write current of the same direction to adjacent selected bit lines: a bit line write current is turned back by using a current return line RL corresponding to one selected bit line. The bit line write current is then transmitted to a selected bit line that is located adjacent to that current return line RL. In other words, each current return line is electrically coupled to a selected bit line located adjacent thereto.

For example, in order to transmit a bit line write current of the same direction to selected bit lines BL1, BL2, current return line RL1 corresponding to selected bit line BL1 turns back a bit line write current flowing through selected bit line BL1. The bit line write current thus turned back by current return line RL1 is transmitted to the following selected bit line BL2. More specifically, selected bit line BL1 and current return line RL1 are electrically coupled together at their one ends (i.e., the ends located on the front side of the figure), and current return line RL1 and selected bit line BL2 are electrically coupled together at the other ends (i.e., the ends located on the back side in the figure).

Similarly, in order to transmit a bit line write current of the same direction to the following selected bit line BL3, current return line RL2 corresponding to selected bit line BL2 turns back a bit line write current flowing through selected bit line BL2. The bit line write current thus turned back by current return line RL2 is transmitted to selected bit line BL3. More specifically, selected bit line BL2 and current return line RL2 are electrically coupled together at their one ends (i.e., the ends located on the front side of the figure), and current return line RL2 and selected bit line BL3 are electrically coupled together at the other ends (i.e., the ends located on the back side in the figure).

As a result, data of a plurality of bits (3 bits) having the same level can be written through series-connected selected bit lines BL1 to BL3 by using a bit line write current that corresponds to a current required to write one bit in the conventional MRAM device.

Figure 4:
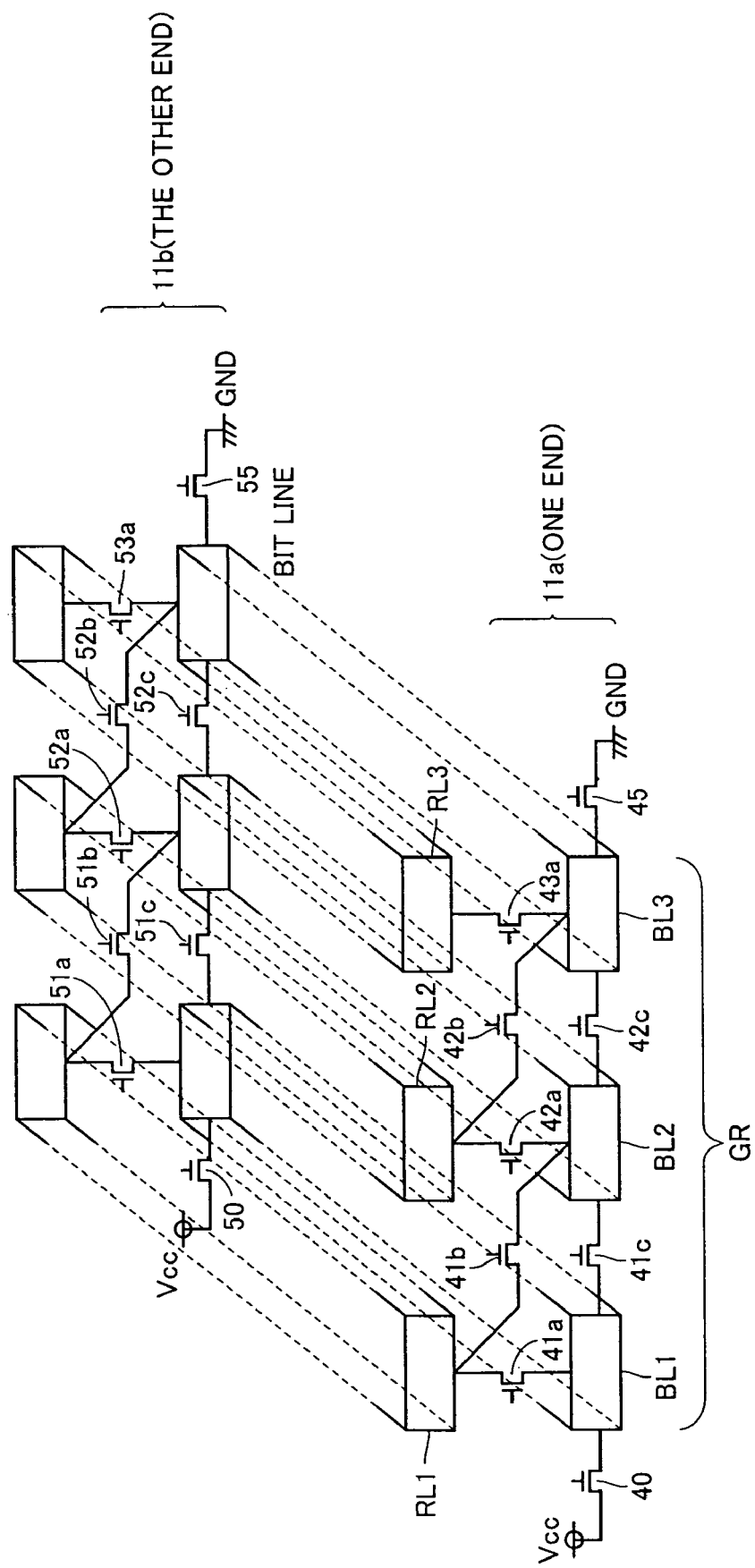
FIG. 4 is a circuit diagram showing the structure of write drivers according to the first embodiment.

Referring to FIG. 4, write drivers 11a, 11b are arranged at both ends of three (K=3) bit lines BL1 to BL3 simultaneously selected for data write operation. Write drivers 11a, 11b are provided for every bit line group. Each bit line group is formed from K bit lines to be selected to write K-bit data. Three (K=3) selected bit lines BL1 to BL3 in FIG. 4 form the same group GR.

Write driver 1a located at one ends of selected bit lines BL1 to BL3 includes transistor switches 40, 41a to 41c, 42a to 42c, 43a, 45. Transistor switch 40 is provided between one end of bit line BL1 selected to write the first bit and power supply voltage Vcc. Transistor switches 41a, 42a, 43a are provided between corresponding selected bit lines BL and current return lines RL, respectively. Transistor switches 41b, 42b are provided between current return lines RL1, RL2 and the following selected bit lines BL2, BL3, respectively. Transistor switches 41c, 42c are each provided between adjacent selected bit lines. Transistor switch 45 is electrically coupled between bit line BL3 selected to write the third (final) bit and ground voltage GND.

Transistor switch 41a is electrically coupled between one ends of selected bit line BL1 and current return line RL1. Transistor switch 42a is electrically coupled between one ends of selected bit line BL2 and current return line RL2. Transistor switch 43a is electrically coupled between one ends of selected bit line BL3 and current return line RL3.

Transistor switch 41b is electrically coupled between one ends of current return line RL1 and selected bit line BL2. Transistor switch 42b is electrically coupled between one ends of current return line RL2 and selected bit line BL3.

Transistor switch 41c is electrically coupled between one ends of selected bit lines BL1 and BL2. Transistor switch 42c is electrically coupled between one ends of selected bit lines BL2 and BL3.

Write driver 11b located at the other ends of selected bit lines BL1 to BL3 includes transistor switches 50, 51a to 51c, 52a to 52c, 53a, 55. Transistor switches 50, 51a to 51c, 52a to 52c, 53a, 55 are arranged at the other ends of selected bit lines BL1 to BL3 and current return lines RL1 to RL3 in the same manner as that of transistor switches 40, 41a to 41c, 42a to 42c, 43a, 45 in write driver 11a.

Figure 5:
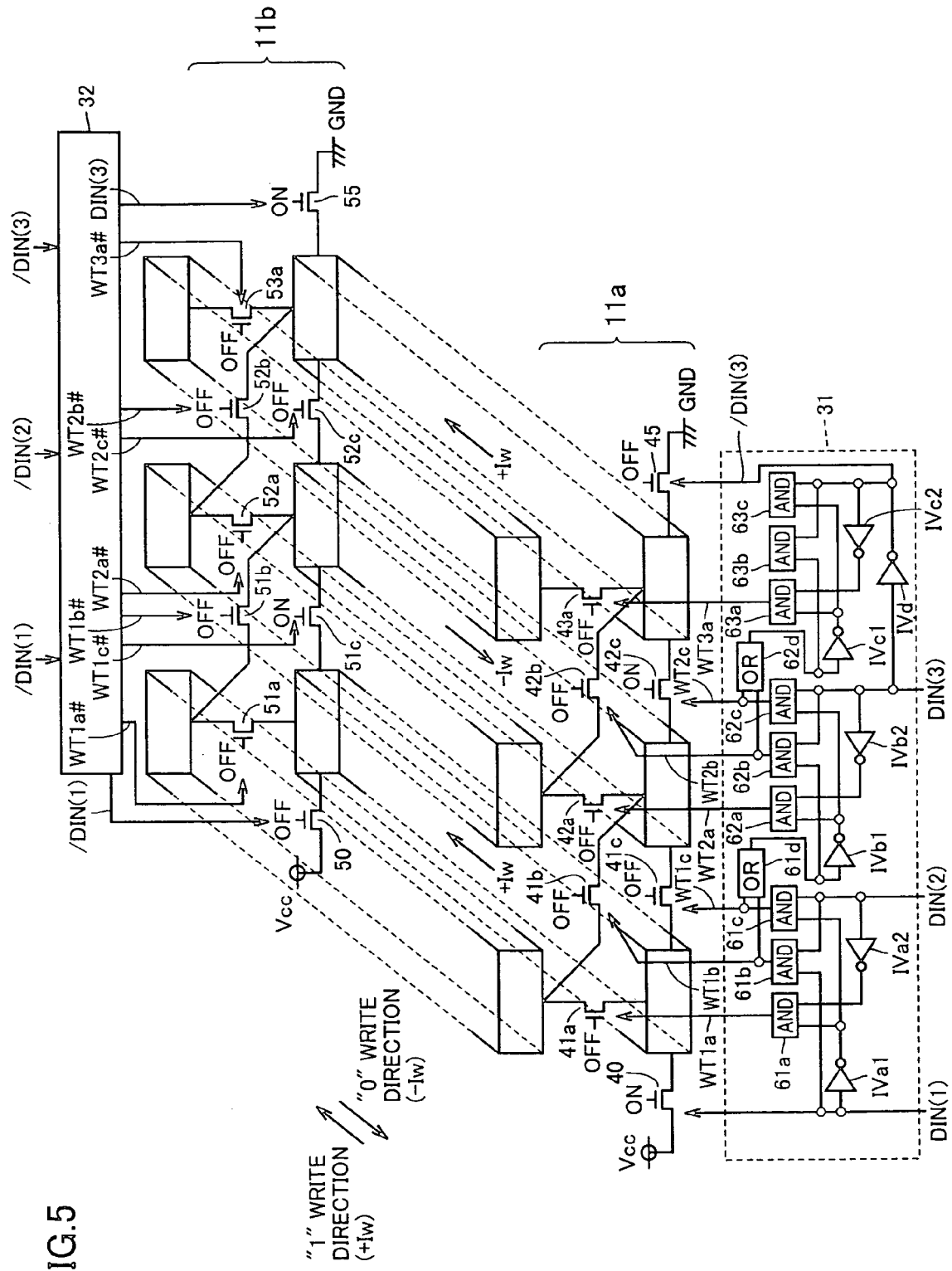
FIG. 5 is a circuit diagram showing the structure of bit line current control circuits for controlling the respective write drivers.

Referring to FIG. 5, bit line current control circuit 31 produces write control signals WT0, WT1a to WT1c, WT2a to WT2c, WT3a according to 3-bit (K=3) data to be written in parallel. The write control signals control ON/OFF of the transistor switch group of write driver 11a located at one ends of the selected bit lines. Hereinafter, each bit of K-bit write data DIN is sometimes referred to as write data DIN(I) (where I is an integer of 1 to K).

Bit line current control circuit 31 includes an inverter IVa1 for inverting write data of the first bit DIN(1), and an inverter IVa2 for inverting write data of the second bit DIN(2). Note that, hereinafter, inverted levels of write data DIN(1) to DIN(3) are referred to as /DIN(1) to /DIN(3), respectively.

Bit line current control circuit 31 further includes logic circuits 61a, 61b, 61c, 61d. Logic circuit 61a outputs the AND logic operation result of write data /DIN(1) and /DIN(2) as a write control signal WT1a. Logic circuit 61b outputs the AND logic operation result of write data DIN(1) and DIN(2) as a write control signal WT1b. Logic circuit 61c outputs the AND logic operation result of write data /DIN(1) and DIN(2) as a write control signal WT1c. Logic circuit 61d outputs the OR logic operation result of write control signals WT1b and WT1c.

Bit line current control circuit 31 further includes inverters IVb1, IVb2, and logic circuits 62a, 62b, 62c, 62d. Inverter IVb1 inverts the output of logic circuit 61d. Inverter IVb2 inverts write data DIN(3). Logic circuit 62a outputs the AND logic operation result of the respective outputs of inverters IVb1 and IVb2 as a write control signal WT2a. Logic circuit 62b outputs the AND logic operation result of the output of logic circuit 61d and write data DIN(3) as a write control signal WT2b. Logic circuit 62c outputs the AND logic operation result of the output of inverter IVb1 and write data DIN(3) as a write control signal WT2c. Logic circuit 62d outputs the OR logic operation result of write control signals WT2b and WT2c.

Bit line current control circuit 31 further includes inverters IVc1, IVd, IVc2, and logic circuits 63a, 63b, 63c. Inverter IVc1 inverts the output of logic circuit 62d. Inverter IVd inverts write data DIN(3). Inverter IVc2 inverts the output of inverter IVd. Logic circuit 63a outputs the AND logic operation result of the respective outputs of inverters IVc1 and IVc2 as a write control signal WT3a. Logic circuit 63b produces the AND logic operation result of the output of logic circuit 62d and write data /DIN(3). Logic circuit 63c produces the AND logic operation result of the output of inverter IVc1 and write data /DIN(3).

In write driver 11a, transistor switch 40 is turned ON/OFF in response to write data DIN(1). Transistor switches 41a to 41c are turned ON/OFF in response to write control signals WT1a to WT1c, respectively. Transistor switches 42a to 42c are turned ON/OFF in response to write control signals WT2a to WT2c, respectively. Transistor switch 43a is turned ON/OFF in response to write control signal WT3a.

Transistor switch 45 is turned ON/OFF in response to inverted data /DIN(3) of write data DIN(3).

A bit line current control circuit 32 for write driver 11b has the same structure as that of bit line current control circuit 31. Bit line current control circuit 32 produces write control signals WT1a# to WT1c#, WT2a# to WT2c#, WT3a# according to write data /DIN(1) to /DIN(3). In other words, write control signals WT1a# to WT1c#, WT2a# to WT2c#, WT3a# have the same level as that of write control signals WT1a to WT1c, WT2a to WT2c, WT3a to WT3c that are produced when inverted write data /DIN(1) to /DIN(3) are applied to bit line control circuit 31 instead of write data DIN(1) to DIN(3).

In write driver 11b, transistor switch 50 is turned ON/OFF in response to inverted data /DIN(1) of write data DIN(1). Transistor switches 51a to 51c are turned ON/OFF in response to write control signals WT1a# to WT1c#, respectively. Transistor switches 52a to 52c are turned ON/OFF in response to write control signals WT2a# to WT2c#, respectively. Transistor switch 53a is turned ON/OFF in response to write control signal WT3a#. Transistor switch 55 is turned ON/OFF in response to write data of the third bit DIN(3).

Accordingly, either transistor switch 40 or 50 is turned ON in response to write data of the first bit DIN(1), and either transistor switch 40 or 55 is turned ON in response to write data of the third ($K^{th}$) bit DIN(3).

With the above structure, selected bit line BL1 corresponding to the first bit of write data DIN is connected to power supply voltage Vcc at one of the ends thereof (i.e., either the end located at write driver 11a or the end located at write driver 11b) according to the level of write data DIN(1).

If write data DIN(1) and DIN(2) have different levels, the other end of bit line BL1 (i.e., the end that is not connected to power supply voltage Vcc) is connected to the following selected bit line BL2. More specifically, either transistor switch 41c or 51c is turned ON according to the levels of write data DIN(1) and DIN(2).

FIG. 5 illustrates control of the write drivers when a bit line write current is supplied to adjacent bit lines in the opposite directions.

As shown in FIG. 5, in order to supply a bit line write current +Iw to bit line BL1 and a bit line write current −Iw to bit line BL2, transistor switch 40 is turned ON and transistor switch 50 is turned OFF. As a result, one end located at write driver 11a of bit line BL1 is connected to power supply voltage Vcc. Since the bit line write current is supplied to bit lines BL1, BL2 in the opposite directions, transistor switches 41a, 41b, 51a, 51b are turned OFF. In order to supply a bit line write current −Iw to bit line BL2, transistor switch 51c is turned ON and transistor switch 41c is turned OFF.

The same structure is provided between bit lines BL2 and BL3. Accordingly, in order to supply a bit line write current to bit lines BL2, BL3 in the opposite directions, transistor switches 42a, 42b, 52a, 52b are turned OFF. In order to supply a bit line write current +Iw to bit line BL3, transistor switch 42c is turned ON and transistor switch 52c is turned OFF.

Selected bit line BL3 corresponding to the third (final) bit of write data DIN is selectively connected to ground voltage GND at both ends by transistor switches 45, 55, respectively. Which of transistor switches 45, 55 is turned ON is determined according to write data DIN(3).

In this way, a bit line write current can be supplied to adjacent selected bit lines in the opposite directions. More specifically, by using a current path formed by power supply voltage Vcc, transistor switch 40, selected bit line BL1, transistor switch 51c, selected bit line BL2, transistor switch 42c, selected bit line BL3, transistor switch 55 and ground voltage GND, bit line write currents +Iw, −Iw, +Iw can be respectively supplied to selected bit lines BL1 to BL3 that are connected in series between power supply voltage Vcc and ground voltage GND.

Note that logic circuits 63b, 63c corresponding to selected bit line BL3 of the final bit are herein provided in order to maintain continuity of the circuit structure. However, logic circuits 63b, 63c may be eliminated. If an additional bit line, which is to be selected to write the data in parallel with bit lines BL1 to BL3, is connected subsequently to bit line BL3, additional transistor switches 43b, 43c are provided for the additional bit line and a corresponding current return line in the same manner as that of transistor switches 41b, 42b and 41c, 42c.

Figure 6:
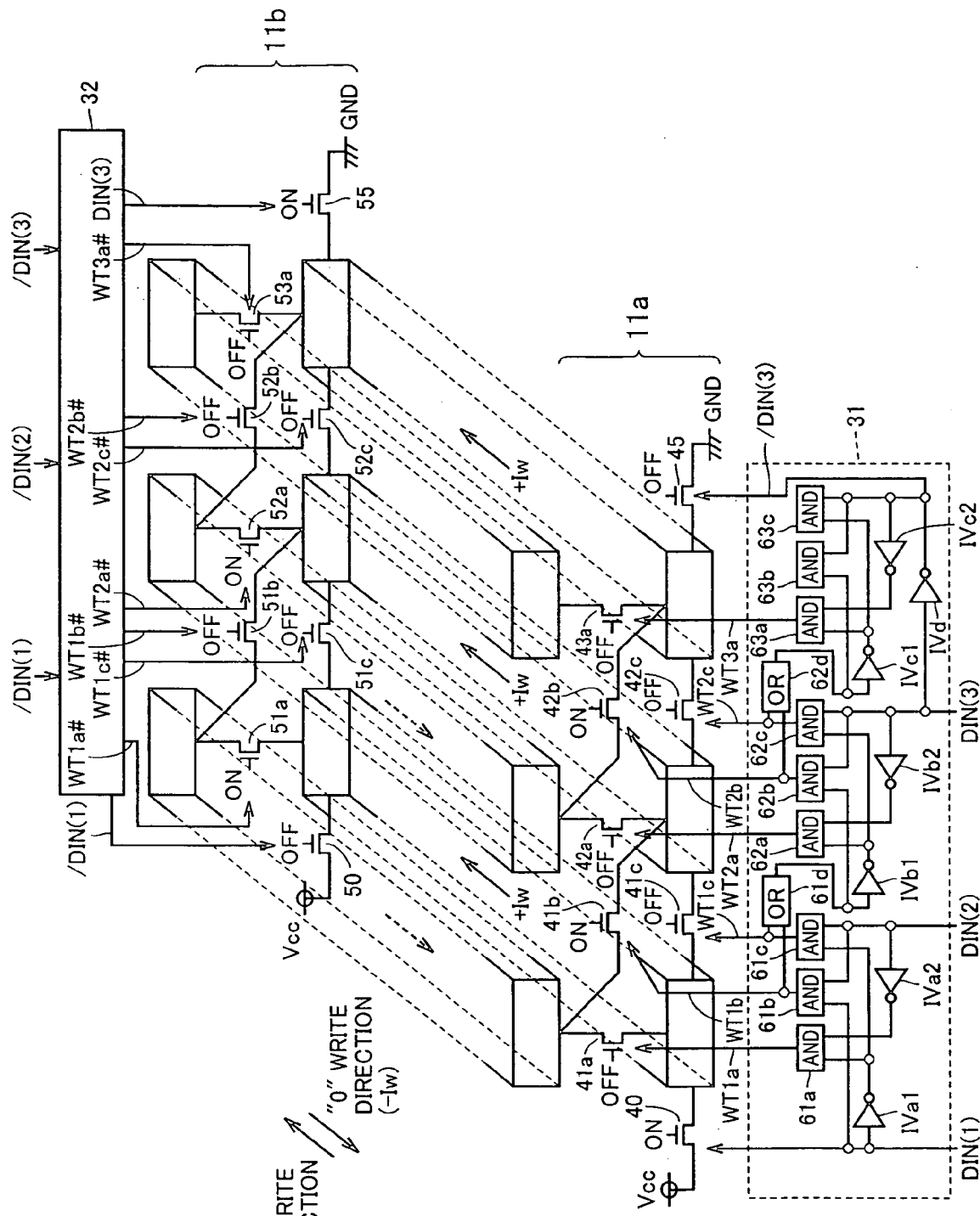
FIG. 6 illustrates how the write drivers are controlled when a bit line write current is applied to each selected bit line in the same direction.

FIG. 6 illustrates how the write drivers are controlled when a bit line write current is supplied to each selected bit line in the same direction. In the example of FIG. 6, a bit line write current +Iw for writing data "1" is supplied to bit lines BL1 to BL3.

Referring to FIG. 6, in order to supply a bit line write current +Iw to selected bit line BL1, transistor switch 40 selected according to write data DIN(1) is turned ON and transistor switch 50 is turned OFF.

In order to supply a bit line write current to selected bit lines BL1, BL2 in the same direction, transistor switches 41c, 51c between the selected bit lines are turned OFF. One end of selected bit line BL1, i.e., the end that is not connected to power supply voltage Vcc, is connected to corresponding current return line RL1. In other words, either transistor switch 41a or 51a is turned ON according to the level of write data DIN(1).

Current return line RL1 is connected to the following bit line BL2 through transistor switch 41b or 51b. More specifically, if write data DIN(1)=DIN(2)="1", transistor switch 41b is turned ON and transistor switch 51b is turned OFF, as shown in FIG. 6. On the other hand, if write data DIN(1)=DIN(2)="0", transistor switch 51b is turned ON and transistor switch 41b is turned OFF.

In this way, a bit line write current of the same direction (i.e., +Iw or −Iw) can be supplied to selected bit lines BL1, BL2. Connection of selected bit lines BL2, BL3 is controlled similarly.

As in the case of FIG. 5, bit line BL3 corresponding to write data DIN(3) of the final bit is coupled to ground voltage GND by either transistor switch 45 or 55 according to the level of write data DIN(3).

As described above, in order to supply a bit line write current to adjacent selected bit lines in the opposite directions by using bit lines BL and current return lines RL corresponding to the respective memory cell columns, adjacent two bit lines are connected to each other at their one ends (located at write driver 11a) or at the other ends (located at write driver 11b) to turn back the bit line write current. On the other hand, in order to supply a bit line write current to adjacent bit lines in the same direction, a current flowing through a bit line BL is turned back by a current return line RL of the same memory cell column and then transmitted to a selected bit line of the following memory cell column.

By forming current return lines RL of the respective memory cell columns in a layer different from that of bit lines BL, a plurality of selected bit lines can be connected in series between power supply voltage Vcc and ground voltage GND through a required number of current return lines RL. Accordingly, a bit line write current can be supplied to each of the plurality of selected bit lines through a single current path in a direction according to the respective bit of write data DIN to be written in parallel. As a result, data of a plurality of bits can be written in parallel without increasing current consumption.

Figure 20:
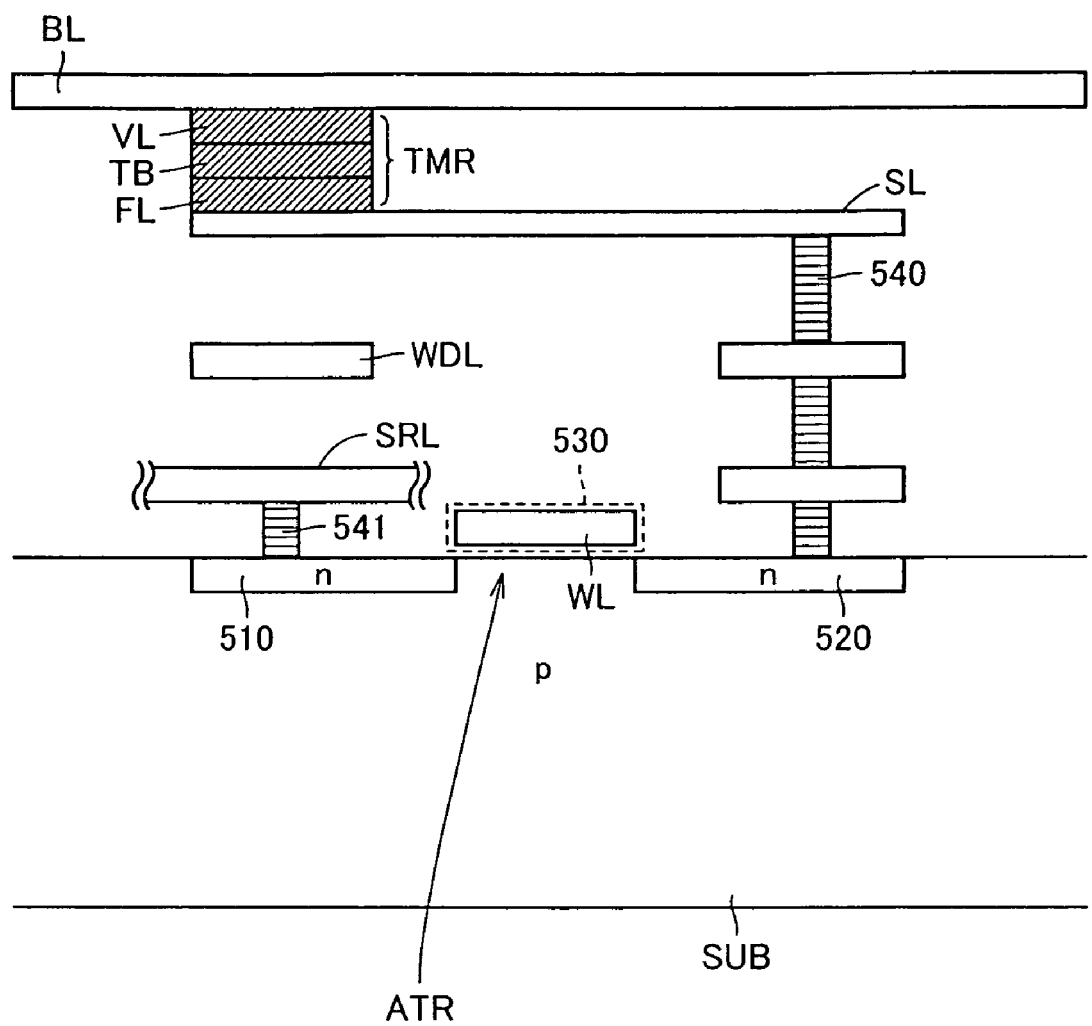
FIG. 20 shows the structure of the MTJ memory cell formed on a semiconductor substrate.

Note that, in the first embodiment, current return lines RL are described as wirings formed in a layer above bit lines BL. However, the current return lines may alternatively be formed in a layer below bit lines BL. For example, source lines SRL for fixing the source voltage of access transistors ATR to ground voltage GND as shown in FIG. 20 may serve as current return lines RL. In data write operation, access transistor ATR in each MTJ memory cell is turned OFF, and therefore source lines SRL are electrically disconnected from bit lines BL.

Accordingly, by providing additional transistor switches for electrically disconnecting source lines SRL from ground voltage GND in data write operation and electrically coupling source lines SRL with ground voltage GND in data read operation, source lines SRL corresponding to the respective memory cell columns can be used as current return lines RL without providing additional wirings.

On the other hand, when current return lines RL are formed in a layer above bit lines BL, a magnetic field generated by current return line RL less adversely affects the non-selected MTJ memory cells due to the increased distance between current return line RL and tunneling magnetoresistance element TMR. In particular, when such a structure is applied to, e.g., a system LSI (Large Scale Integrated circuit) that generally has a large number of wiring layers, current return lines RL can be easily arranged without causing any penalty in terms of area.

Note that the example of writing 3-bit write data in parallel is described in the first embodiment. However, the present invention is not limited to this. Data of any number of bits can be written in parallel by determining the number of bit lines BL of each bit line group GR according to the number of bits of the write data, and providing the same structure as that of write drivers 11a, 11b and bit line current control circuits 31, 32 according to the number of bit lines BL of the same bit line group GR.

Note that, in FIG. 4, each transistor switch included in write drivers 11a, 11b is an N-channel MOS (Metal-Oxide Semiconductor) transistor. However, these transistor switches may be P-channel MOS transistors. In this case, the polarities of the signal levels to be applied to the gates of the transistor switches must be reversed from those in the examples of FIGS. 5 and 6.

Second Embodiment

In the second embodiment, the structure for simplifying a write driver for controlling a bit line write current will be described.

Figure 7:
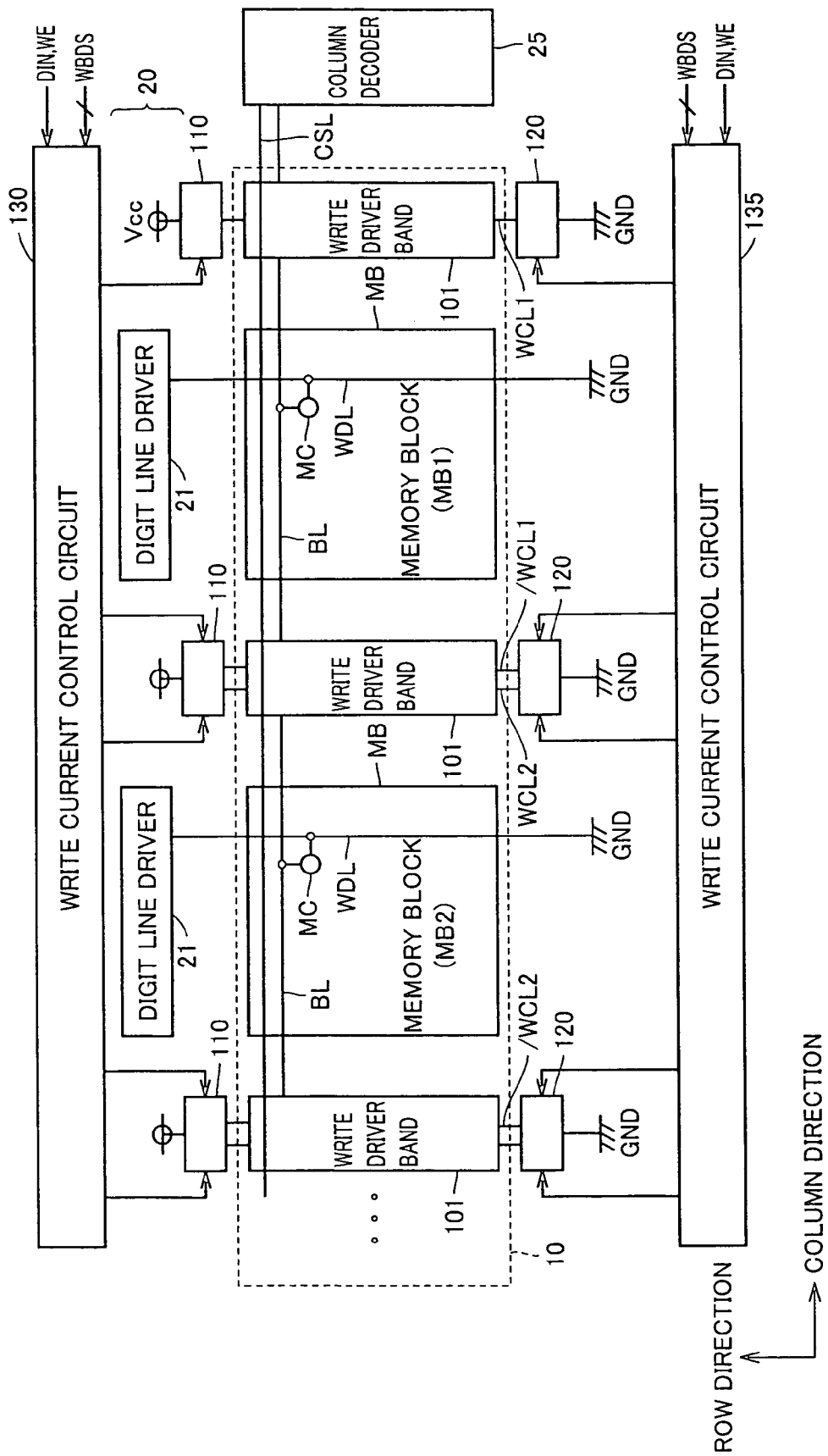
FIG. 7 is a block diagram showing the structure of a memory array according to a second embodiment of the present invention.

Referring to FIG. 7, in the second embodiment as well, a plurality of memory cells in memory array 10 are divided along the row direction into a plurality of memory blocks. FIG. 7 exemplarily shows first and second memory blocks MB1, MB2 of the plurality of memory blocks MB, and circuitry for supplying a bit line current to these memory blocks.

As in the case of FIG. 2, a write driver band 101 is provided in each of the regions between adjacent memory blocks and the regions outside the memory blocks located at both ends. Digit line drivers 21 are provided corresponding to the respective memory blocks. Each digit line driver 21 controls activation of write digit line WDL in a corresponding memory block MB based on the row selection result. A data write current Ip of a fixed direction flows through the activated write digit line WDL.

The second embodiment is different from the first embodiment in that write current control lines WCL, /WCL are arranged in write driver bands 101. More specifically, write current control lines WCL, /WCL extend in the row direction on both sides of each memory block MB. FIG. 7 exemplarily shows write current control lines WCL1, /WCL1 and WCL2, /WCL2 corresponding to memory blocks MB1, MB2.

In the second embodiment, connection control portions 110, 120 are provided for each memory block MB. Connection control portion 110 controls connection between write current control lines WCL, /WCL and power supply voltage Vcc. Connection control portion 120 controls connection between write current control lines WCL, /WCL and ground voltage GND.

Write current control circuits 130, 135 are provided for connection control portions 110, 120, respectively. Each of write current control circuits 130, 135 controls a corresponding connection control portion 110, 120 in data write operation according to a write block decode signal WBDS and write data DIN. Write block decode signal WBDS indicates a memory block to be written.

The column selection result of column decoder 25 is transmitted to each write driver band 101 through a column selection line CSL. Column selection lines CSL are arranged corresponding to the respective memory cell columns. A column selection line CSL of the selected column is activated to H level. Each column selection line CSL is shared by a plurality of memory blocks MB. Accordingly, even when memory array 10 is divided into a plurality of memory blocks for increased capacity, the column selection result can be transmitted to each memory block without increasing the number of signal lines.

Figure 8:
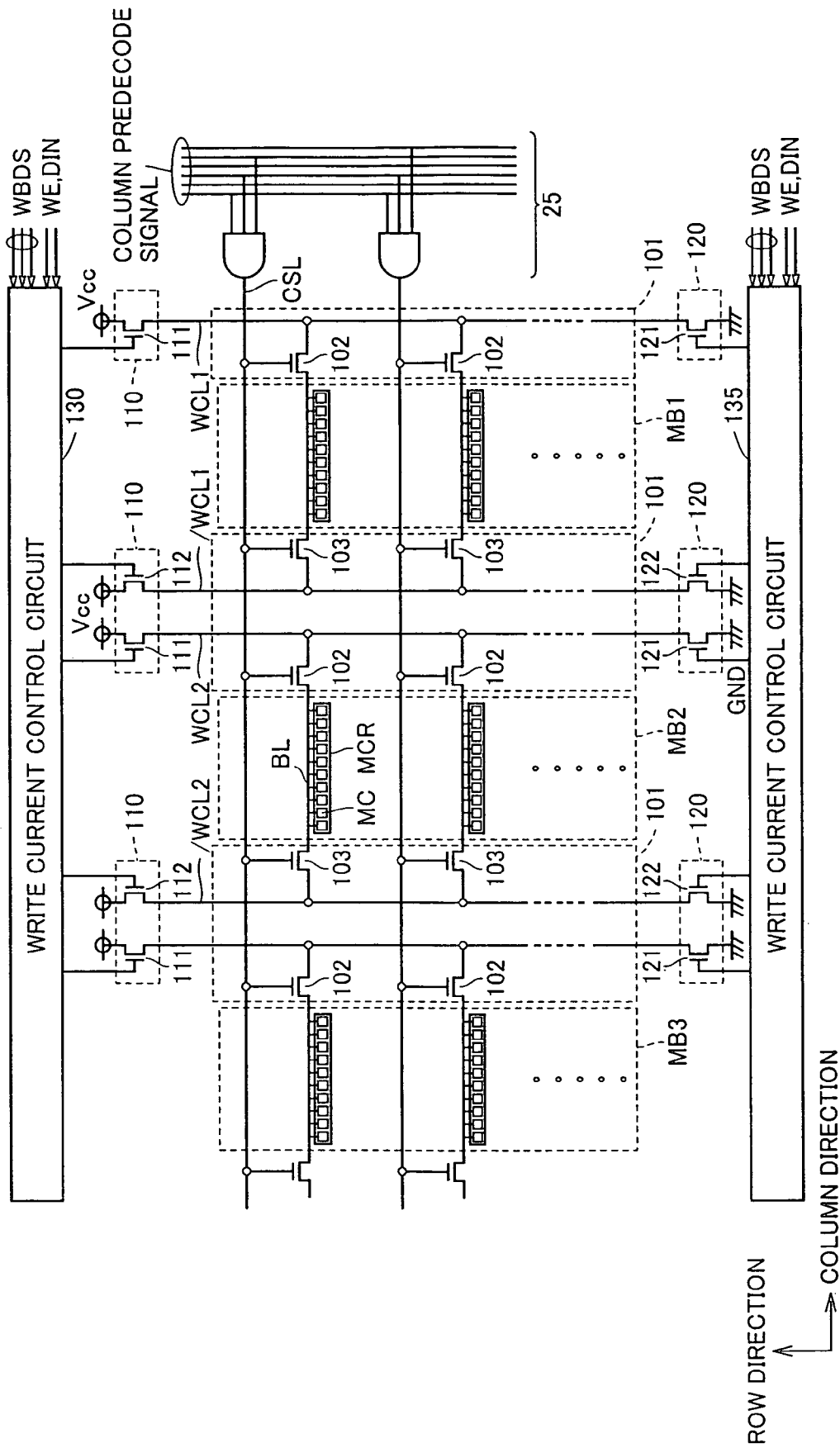
FIG. 8 is a circuit diagram specifically showing the structure of write driver bands and connection control portions in FIG. 7.

Referring to FIG. 8, in each memory block MB, bit lines BL are arranged corresponding to the respective memory cell columns MCR. Write current control lines WCL, /WCL are shared by a plurality of memory cell columns MCR in a corresponding memory block MB.

Note that the write driver bands and the connection control portions have the same structure in each memory block MB. Therefore, the structure corresponding to memory block MB2 will now be described. In memory block MB2, each bit line BL is electrically coupled to write current control lines WCL2, /WCL2 through transistor switches 102, 103 included in the write drivers, respectively. Transistor switches 102, 103 have their gates connected to a corresponding column selection line CSL.

Column decoder 25 activates a column selection line CSL of the selected column to H level in response to a column predecode signal obtained from a column address CA.

In connection control portions 110 corresponding to memory block MB2, transistor switch 111 is electrically coupled between power supply voltage Vcc and one end of write current control line WCL2, and transistor switch 112 is electrically coupled between power supply voltage Vcc and one end of write current control line /WCL2. In connection control portions 120 corresponding to memory block MB2, transistor switch 121 is electrically coupled between ground voltage GND and the other end of write current control line WCL2, and transistor switch 122 is electrically coupled between ground voltage GND and the other end of write current control line /WCL2.

Figure 9:
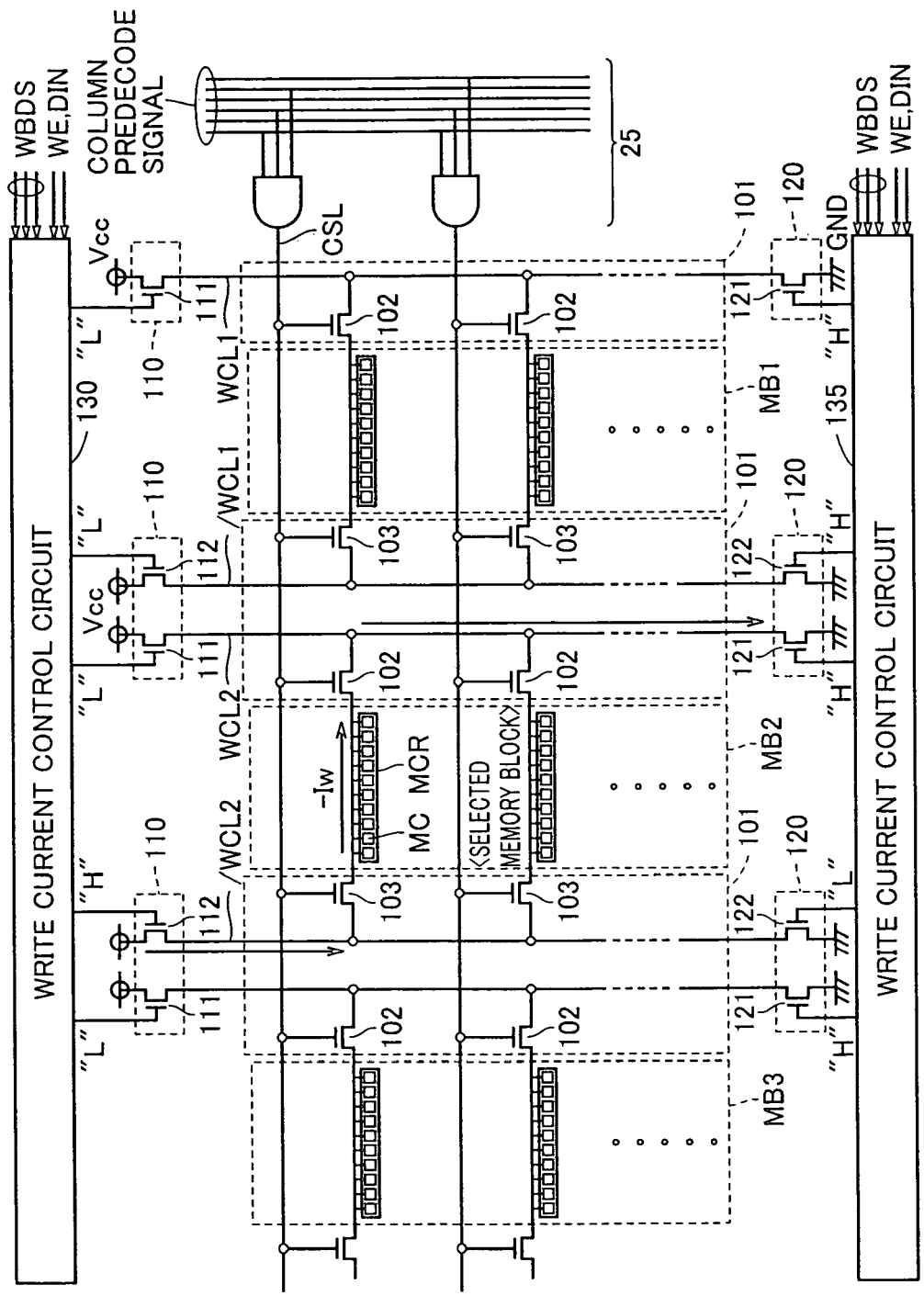
FIG. 9 is a circuit diagram illustrating supply of a bit line write current according to a second embodiment of the present invention.

FIG. 9 exemplarily illustrates how a bit line write current is supplied when a black memory cell in memory block MB2 is selected for data write operation.

Transistor switches 102, 103 included in the write drivers corresponding to the memory cell column of the selected memory cell are turned ON in response to activation of a corresponding column selection line. As a result, the selected bit line corresponding to the selected memory cell is connected between write current control lines WCL2, /WCL2.

The voltages of write current control lines WCL2, /WCL2 are set according to the direction of a bit line write current supplied to the selected bit line, that is, the write data level to the selected memory cell. For example, when data "0" is written to the selected memory cell, write current control line /WCL2 is set to H level (power supply voltage Vcc) and write current control line WCL2 is se to L level (ground voltage GND) in order to supply a bit line write current −Iw to the selected bit line.

Accordingly, in connection control portions 110, an H-level signal is applied to the gate of transistor switch 112 corresponding to memory block MB2, and an L-level signal is applied to the gate of transistor switch 111 corresponding to memory block MB2. In connection control portions 120, an H-level signal is applied to the gate of transistor switch 121 corresponding to memory block MB2 and an L-level signal is applied to the gate of transistor switch 122 corresponding to memory block MB2. This allows a bit line write current −Iw for writing data "0" to the selected memory cell to be supplied to the current path formed by power supply voltage Vcc, transistor switch 112, write current control line /WCL2, transistor switch 103, selected bit line, transistor switch 102, write current control line WCL2, transistor switch 121 and ground voltage GND.

On the other hand, in the non-selected memory blocks, e.g., in memory block MB1, an L-level signal is applied to the gates of corresponding transistor switches 111, 112 in connection control portions 110 in order to turn OFF these transistor switches 111, 112. Moreover, an H-level signal is applied to the gates of corresponding transistor switches 121, 122 in connection control portions 120 in order to turn ON these transistor switches 121, 122. As a result, write current control lines WCL, /WCL in the non-selected blocks are fixed to ground voltage GND.

This prevents a data write current from accidentally flowing through the bit lines in the non-selected memory blocks. Accordingly, erroneous write operation is prevented, enabling stable operation of the MRAM device.

Figure 10:
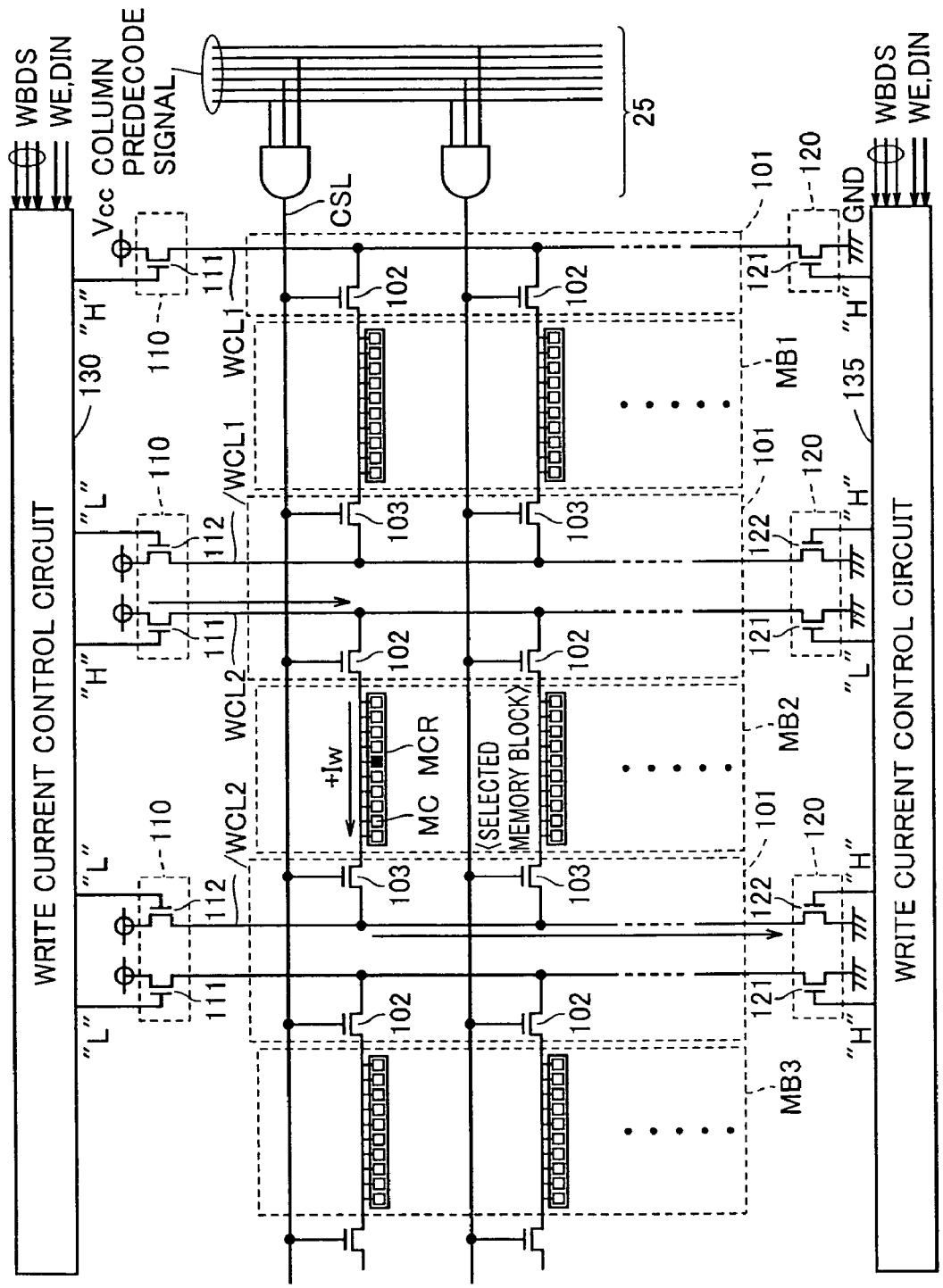
FIG. 10 is another circuit diagram illustrating supply of a bit line write current according to the second embodiment.

FIG. 10 illustrates operation of writing data "1" to the same selected memory cell as that of FIG. 9 (i.e., the black memory cell in FIG. 10).

In this case as well, transistor switches 102, 103 corresponding to the selected memory cell are turned ON, whereby the selected bit line is connected between write current control lines WCL2, /WCL2.

In order to supply a bit line write current +Iw to the selected bit line, write current control line WCL2 is set to H level (power supply voltage Vcc), and write current control line /WCL2 is set to L level (ground voltage GND).

Accordingly, in connection control portions 110, an H-level signal is applied to the gate of transistor switch 111 corresponding to memory block MB2, and an L-level signal is applied to the gate of transistor switch 112 corresponding to memory block MB2. In connection control portions 120, an H-level signal is applied to the gate of transistor switch 122 corresponding to memory block MB2, and an L-level signal is applied to the gate of transistor switch 121 corresponding to a memory block MB2. This allows a bit line write current +Iw for writing data "1" to the selected memory cell can be supplied to the current path formed by power supply voltage Vcc, transistor switch 111, write current control line WCL2, transistor switch 102, selected bit line, transistor switch 103, write current control line /WCL2, transistor switch 122 and ground voltage GND.

In the non-selected blocks, corresponding write current control lines WCL, /WCL are fixed to ground voltage GND as in the case of FIG. 9.

Hereinafter, the structure of write current control circuits 130, 135 for controlling a voltage on the write current control lines in the selected block and non-selected blocks as shown in FIGS. 9 and 10 will be described specifically.

Figure 11:
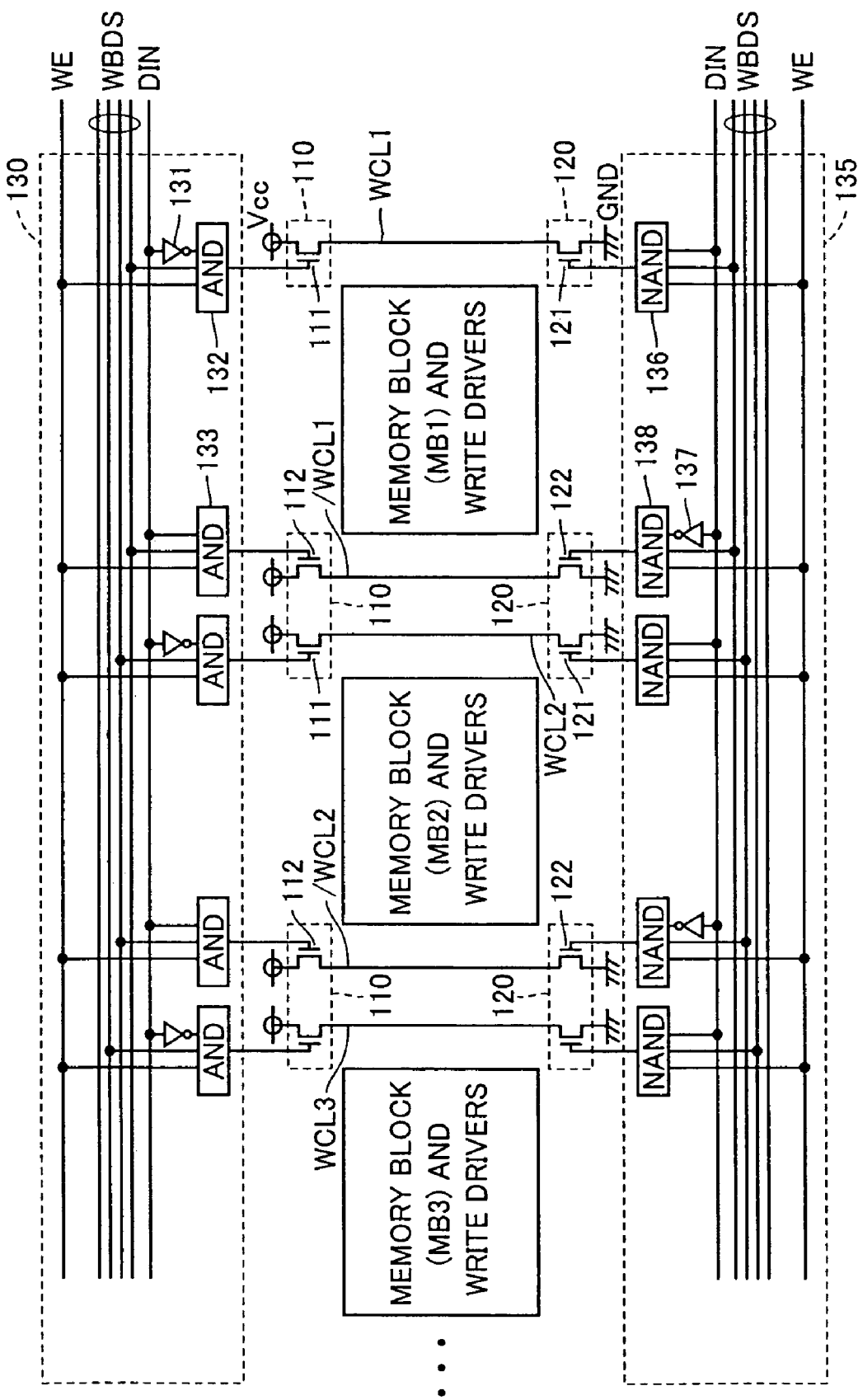
FIG. 11 is a circuit diagram showing the structure of write current control circuits according to the second embodiment.

Referring to FIG. 11, write current control circuit 130 includes an inverter 131 and logic circuits 132, 133 for every memory block MC. Each inverter 131 inverts the level of write data DIN to the selected memory block, and outputs the inverted write data. Each logic circuit 132 receives a write block decode signal WBDS indicating whether a corresponding memory block is selected or not, a control signal WE that is activated (to H level) in data write operation, and the output of a corresponding inverter 131, and outputs the AND logic operation result thereof to the gate of a corresponding transistor switch 111. Each logic circuit 133 outputs the AND logic operation result of write block decode signal WBDS, control signal WE and write data DIN to the gate of a corresponding transistor switch 112.

Accordingly, in operation other than data write operation, the respective outputs of logic circuits 132, 133 corresponding to each memory block are set to L level. In data write operation, the respective outputs of logic circuits 132, 133 corresponding to the non-selected memory blocks are set to L level. In contrast, in data write operation, the respective outputs of logic circuits 132, 133 corresponding to the selected memory block are complementarily set to H level and L level, or L level and H level, respectively, according to the level of write data DIN.

Write current control circuit 135 includes an inverter 137 and logic circuits 136, 138 for every memory block MB. Like inverter 131, each inverter 137 inverts the level of write data DIN for output. Each logic circuit 138 receives a write block decode signal WBDS, a control signal WE and the output of a corresponding inverter 137 (i.e., receives the same inputs as those of logic circuit 132), and outputs the NAND logic operation result thereof to the gate of a corresponding transistor switch 122. Each logic circuit 136 receives the same inputs as those of logic circuit 133, and outputs the NAND logic operation result thereof to the gate of transistor switch 122.

Like logic circuits 132, 133, in operation other than output data write operation, the respective outputs of logic circuits 136, 138 corresponding to each memory block are set to L level. In write operation, the respective outputs of logic circuits 136, 138 corresponding to the non-selected memory block are set to L level.

On the other hand, in data write operation, the respective outputs of logic circuits 136, 138 corresponding to the selected memory block are complementarily set to H level and L level, or L level and H level, respectively, according to the level of write data DIN. In particular, the respective outputs of logic circuits 132, 136 are set complementarily, and the respective outputs of logic circuits 133, 138 are also set complementarily.

With the above structure, in operation other than output data write operation, connection control portions 110, 120 corresponding to each memory block connect write current control lines WCL, /WCL to ground voltage GND. In data write operation, connection control portions 110, 120 corresponding to the non-selected blocks connect corresponding write current control lines WCL, /WCL to power supply voltage Vcc and ground voltage GND, or ground voltage GND and power supply voltage Vcc, respectively, according to write data DIN. As a result, a bit line write current can be supplied to each memory block in the manner as shown in FIGS. 9 and 10.

According to the second embodiment, a bit line write current is supplied through write current control lines WCL, /WCL shared by a plurality of memory cell columns. This simplifies the structure of the write driver provided for every bit line BL. More specifically, each write driver can be formed only from two transistor switches 102, 103.

In other words, since the write drivers corresponding to the same memory block share write current control lines WCL, /WCL, the structure of each write driver can be simplified.

Figure 12:
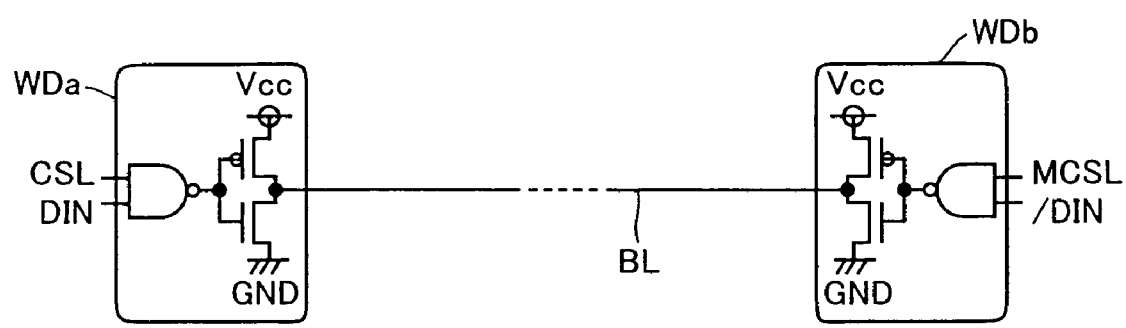
FIG. 12 is a circuit diagram showing the structure of write drivers each formed from a CMOS (Complementary Metal-Oxide Semiconductor) inverter.

The number of transistor switches can be reduced by half from the structure of FIG. 12. In the structure of FIG. 12, write drivers WDa, WDb located at both ends of each bit line control connection between the ends of the selected bit line and power supply voltage Vcc and ground voltage GND according to write data DIN. Write drivers WDa, WDb are formed from a CMOS (Complementary Metal-Oxide Semiconductor device) inverter. Such reduction in the number of transistor switches enables reduction in area of the MRAM device.

Third Embodiment

In the third embodiment, the structure for writing data of a plurality of bits in parallel will be described. It is herein assumed that each write driver of the third embodiment has the same structure as that of the second embodiment.

Figure 13:
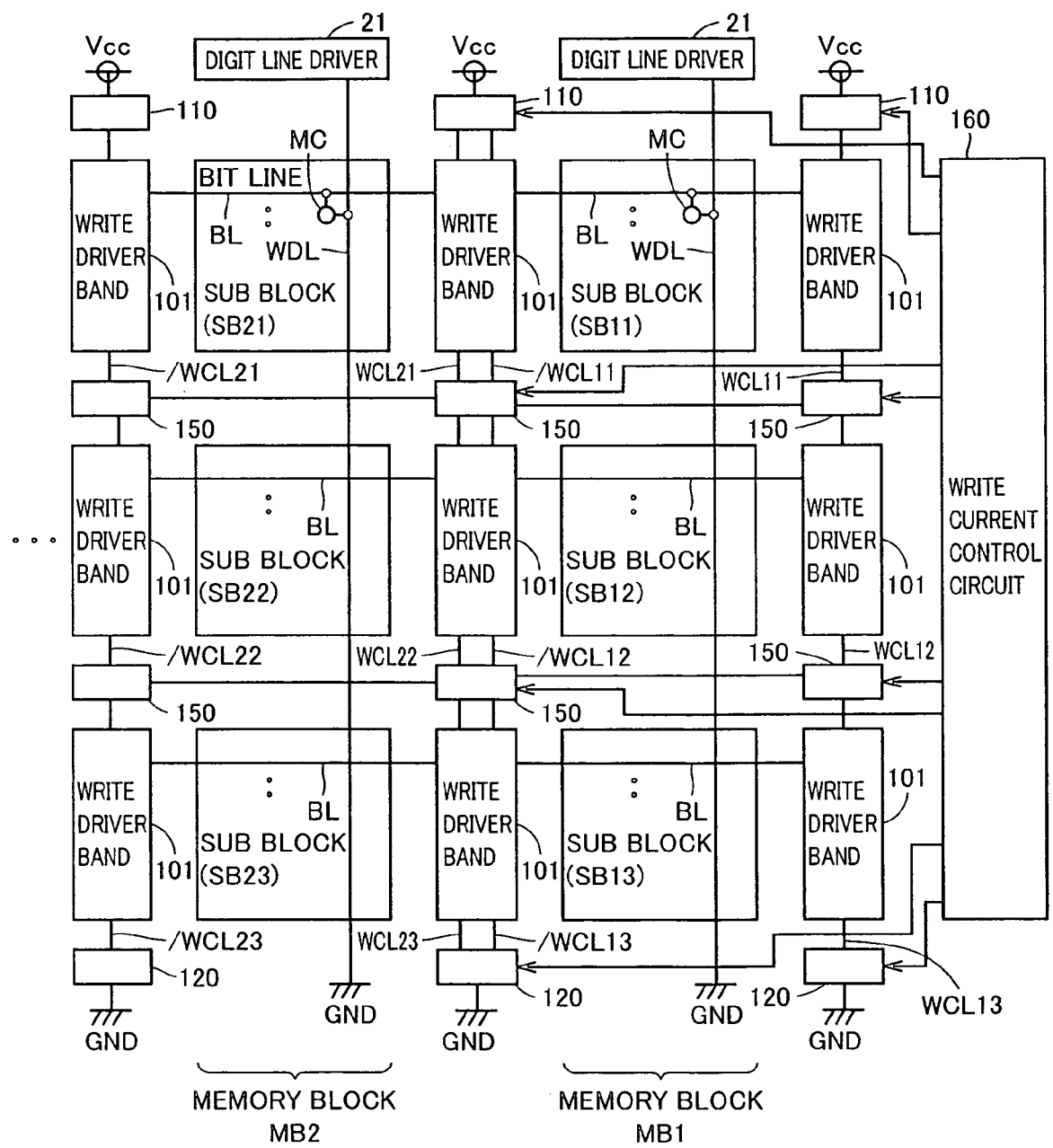
FIG. 13 is a block diagram showing the structure of a memory array according to a third embodiment of the present invention.

Referring to FIG. 13, in the third embodiment, each memory block MB is divided along the column direction into K sub blocks SB. FIG. 13 exemplarily shows the structure of K=3. In this case, memory block MB1 is divided into sub blocks SB11 to SB13, and memory block MB2 is divided into sub blocks SB21 to SB23.

In the third embodiment, K-bit data is written in parallel to K sub blocks of the selected memory block, respectively. As in the first and second embodiments, digit line driver 21 is provided for every memory block. A plurality of sub blocks (K sub blocks) of the same memory block has common write digit lines WDL arranged corresponding to the respective memory cell rows.

Although not specifically shown in the figure, write driver bands 101 at both ends of each sub block include the same write drivers as those of the second embodiment. In each memory block, write current control lines WCL, /WCL are divided by K sub blocks SB.

For example, write current control lines WCL1, /WCL1 corresponding to memory block MB1 are divided into write current control lines WCL11 to WCL13, /WCL11 to /WCL13 by sub blocks SB11 to SB13. Similarly, write current control lines WCL2, /WCL2 corresponding to memory block MB2 are divided into write current control lines WCL21 to WCL23, /WCL21 to /WCL23 by sub blocks SB21 to SB23.

Independent write current control lines WCL, /WCL are thus arranged at both ends of each sub block SB. A bit line write current ±Iw is supplied to each memory block in the same manner as that of the second embodiment.

In the selected memory block, a single memory cell row is selected according to the row selection result. In each of a plurality of sub blocks SB (K sub blocks SB) of the selected memory block, a single memory cell column is selected according to the column selection result. A bit line write current ±Iw according to the respective bits of write data DIN is then supplied to the selected bit lines.

In the third embodiment, current direction regulating circuits 150 are provided between every adjacent sub blocks of each memory block. Current direction regulating circuits 150 between adjacent sub blocks control connection between write current control lines WCL and /WCL corresponding to those sub blocks. For example, current direction regulating circuits 150 between sub blocks SB11 and SB12 control connection between write current control lines WCL11 and /WCL11 and between write current control lines WCL12 and /WCL12. A write current control circuit 160 according to the third embodiment controls operation of each current direction regulating circuit 150.

Figure 14:
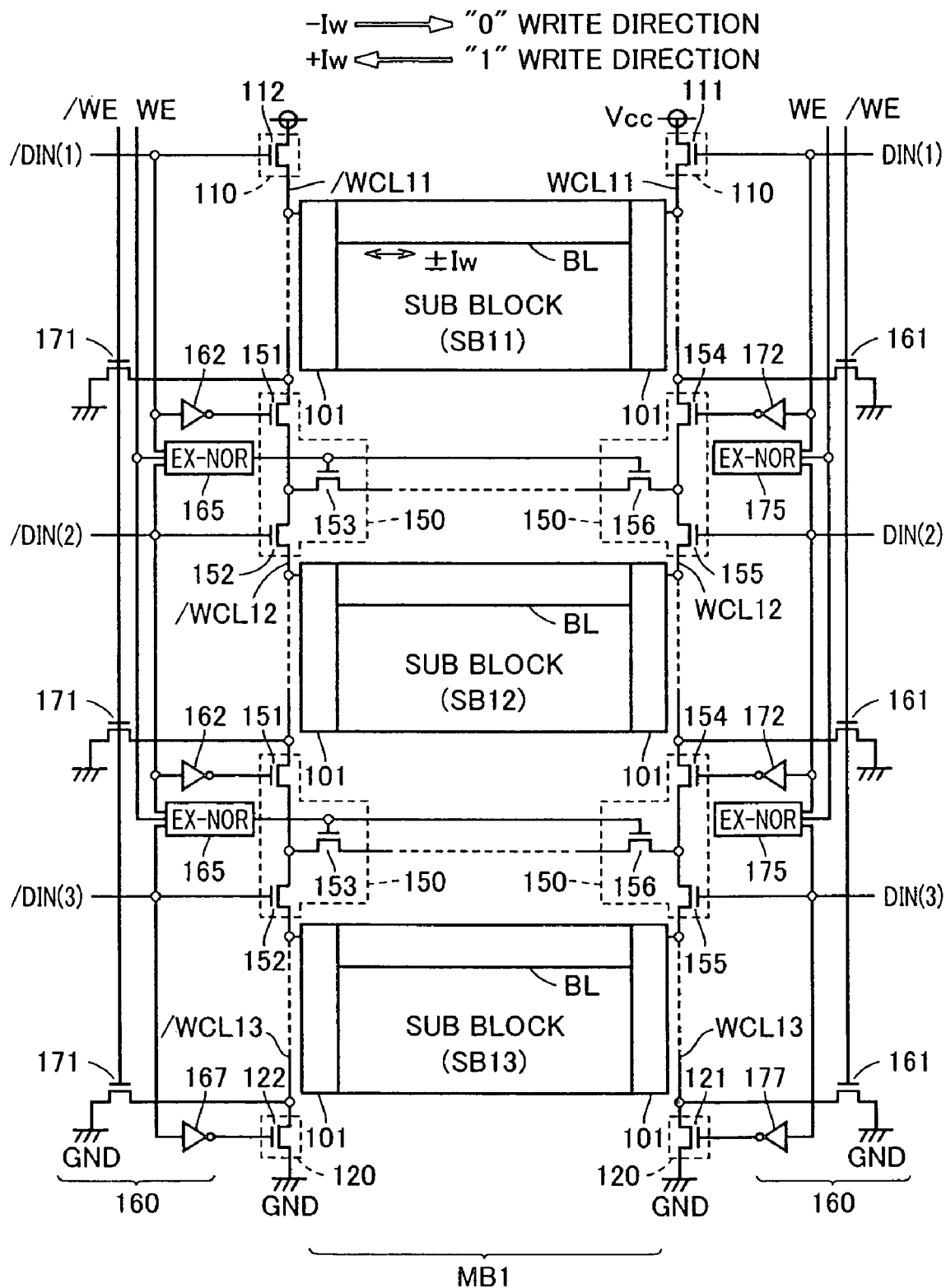
FIG. 14 is a circuit diagram illustrating the structure of a write current control circuit according to the third embodiment.

FIG. 14 is a circuit diagram showing the structure of write current control circuit 160 of the third embodiment. FIG. 14 shows a part of write current control circuit 160 that corresponds to memory block MB1.

Referring to FIG. 14, transistor switches 111, 112 are respectively provided in connection control portion 110 corresponding to memory block MB1. More specifically, transistor switches 111, 112 are respectively connected between power supply voltage Vcc and write current control lines WCL11, /WCL11. Write current control lines WCL11, /WCL11 correspond to first sub block SB11 to which write data of the first bit DIN(1) is to be written.

Similarly, transistor switches 121, 122 are respectively provided in connection control portions 120 corresponding to memory block MB1. More specifically, transistor switches 121, 122 are respectively connected between ground voltage GND and write current control lines WCL13, /WCL13. Write current control lines WCL13, /WCL13 correspond to third sub block SB13 to which write data of the third ($K^{th}$) bit DIN(3), that is, write data of the final bit, is to be written.

Current direction regulating circuits 150 having the same structure are arranged between sub blocks SB11 and SB12 and between sub blocks SB12 and SB13. Hereinafter, the structure of current direction regulating circuits 150 between sub blocks SB1 and SB12 will be described.

Current direction regulating circuit 150 include transistor switches 151, 152, 154, and 155. Transistor switches 154, 155 are connected in series between corresponding two write current control lines WCL11 and WCL12. Transistor switches 151, 152 connected in series between corresponding two write current control lines /WCL11 and /WCL12. Current direction regulating circuit 150 further include transistor switches 153 and 156. Transistor switches 153 and 156 are connected in series between a connection node of transistor switches 151, 152 and a connection node of transistor switches 154, 155.

Write current control circuit 160 applies write data DIN (1) (i.e., write data to first sub block SB11) and inverted write data /DIN(1) to the gates of transistor switches 111, 112, respectively. Write current control circuit 160 also applies write data DIN(3) (i.e., write data to third (final) sub block SB13) and inverted write data /DIN(3) to the gates of transistor switches 122, 121, respectively. In other words, write data DIN(3) and inverted write data /DIN(3) are respectively inverted by inverters 177, 167 before being applied to the gates of transistor switches 121, 122.

In current direction regulating circuits 150 between adjacent sub blocks SB11 and SB12, write data DIN(1) is applied to the gate of transistor switch 151, and write data DIN(2) is applied to the gate of transistor switch 155. Inverted write data /DIN(2) is applied to the gate of transistor switch 152. Inverted write data /DIN(1) from an inverter 172 is applied to the gate of transistor switch 154.

Write current control circuit 160 further includes logic circuits 165, 175 respectively corresponding to current direction regulating circuits 150. In other words, logic circuits 165, 175 are provided between every adjacent sub blocks. Each logic circuit 165 outputs the comparison result of the write data corresponding to adjacent sub blocks to the gates of transistor switches 153, 156.

For example, logic circuit 165 between sub blocks SB11 and SB12 outputs the comparison result (exclusive-NOR operation result) of inverted write data /DIN(1) and /DIN(2). Logic circuit 175 between sub blocks SB11 and SB12 outputs the comparison result (exclusive-NOR operation result) of write data DIN(1) and DIN(2). Note that either the output of logic circuit 165 or the output of logic circuit 175 may be applied to the gates of transistor switches 153, 156. One of logic circuits 165, 175 may be eliminated.

With the above structure, transistor switches 153, 156 are turned ON when write data having the same level are written to adjacent sub blocks. Transistor switches 152, 154 or transistor switches 151, 155 are turned ON according to the write data level. As a result, a bit line write current is turned back by current direction regulating circuits 150 between adjacent sub blocks.

When write data having different levels are written to adjacent sub blocks, a bit line write current can be turned back by a selected bit line of the latter sub block. Accordingly, transistor switches 153, 156 are turned OFF. Transistor switches 154, 155 or transistor switches 151, 152 are turned ON according to the write data levels.

For example, when write data DIN(1) and DIN(2) have the same level, current direction regulating circuits 150 between sub blocks SB11 and SB12 electrically couple write current control lines WCL11 and /WCL12 or write current control lines /WCL11 and WCL12 to each other according to the write data level. On the other hand, when write data DIN(1) and DIN(2) have different levels, current direction regulating circuits 150 between sub blocks SB11 and SB12 electrically couple write current control lines /WCL11 and /WCL12 or write current control lines WCL11 and WCL12 to each other according to the write data levels.

Write current control circuit. 160 further includes transistor switches 161, 171 for each sub block SB. Each transistor switch 161 is connected between a corresponding write current control line WCL and ground voltage GND. Each transistor switch 171 is connected between a corresponding write current control line /WCL and ground voltage GND. A control signal /WE is applied to the respective gates of transistor switches 161, 171. Control signal /WE is set to H level in operation other than data write operation. Accordingly, in operation other than data write operation, write current control lines WCL, /WCL corresponding to each sub block SB are fixed to ground voltage GND.

Figure 15:
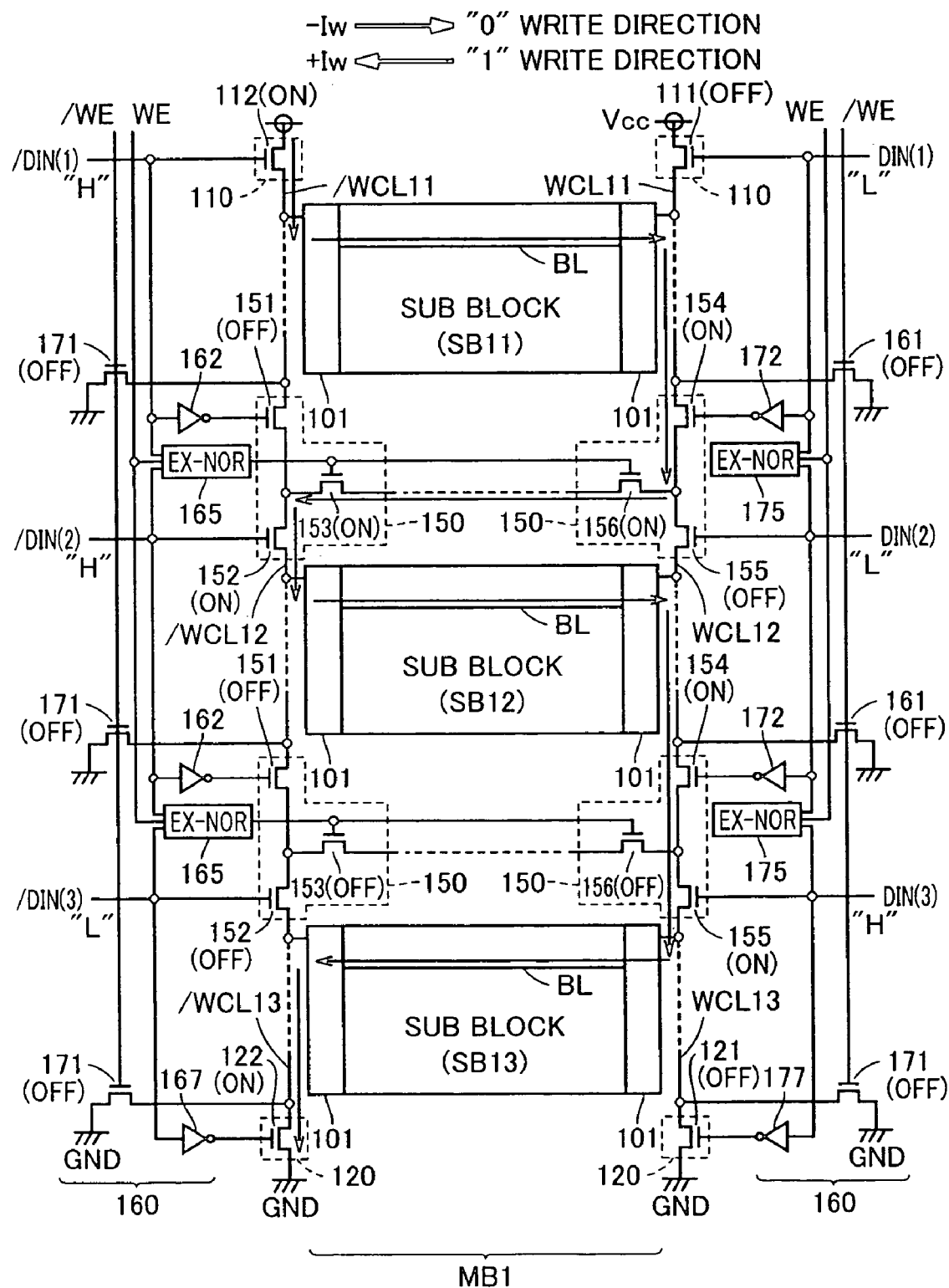
FIG. 15 is a circuit diagram illustrating supply of a bit line write current in the third embodiment.
Figure 16:
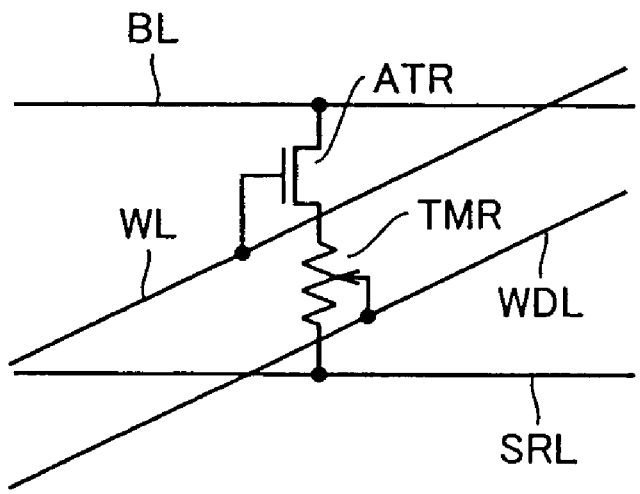
FIG. 16 schematically shows the structure of an MTJ memory cell.
Figure 17:
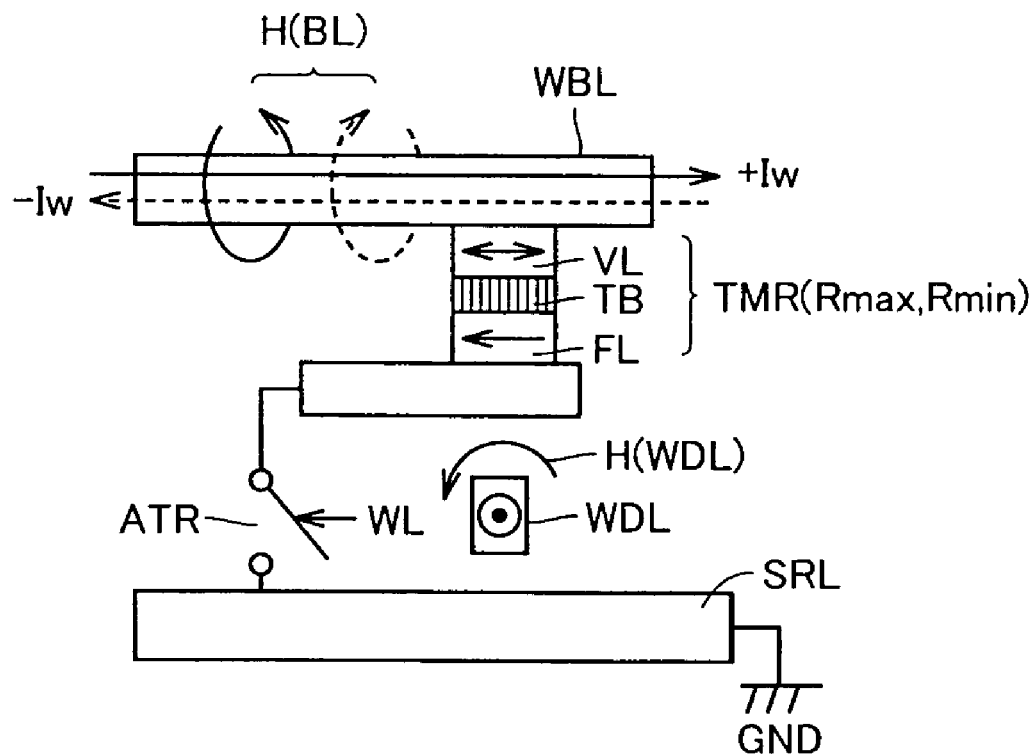
FIG. 17 is a conceptual diagram illustrating data write operation to the MTJ memory cell.
Figure 18:
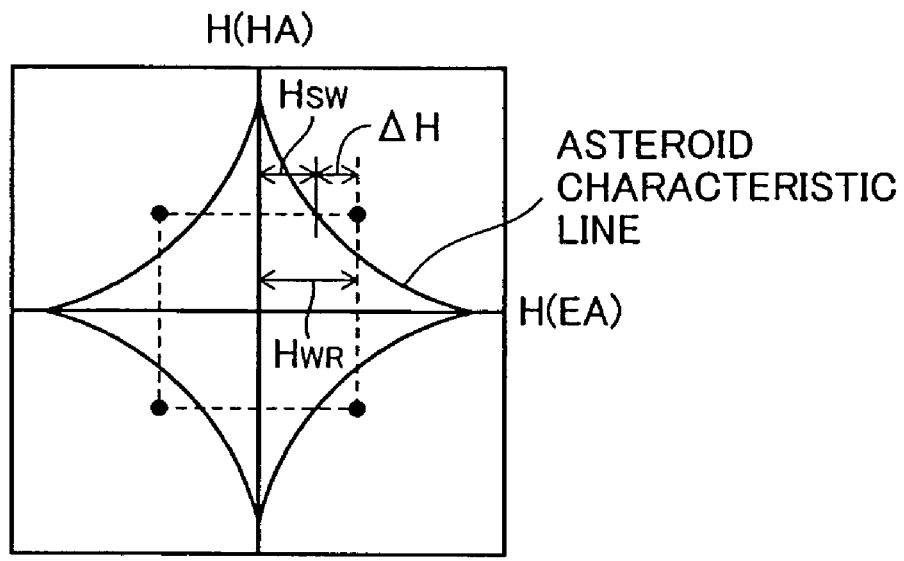
FIG. 18 is a conceptual diagram illustrating the relation between a data write current and the magnetization direction of a tunneling magneto-resistance element in data write operation.
Figure 19:
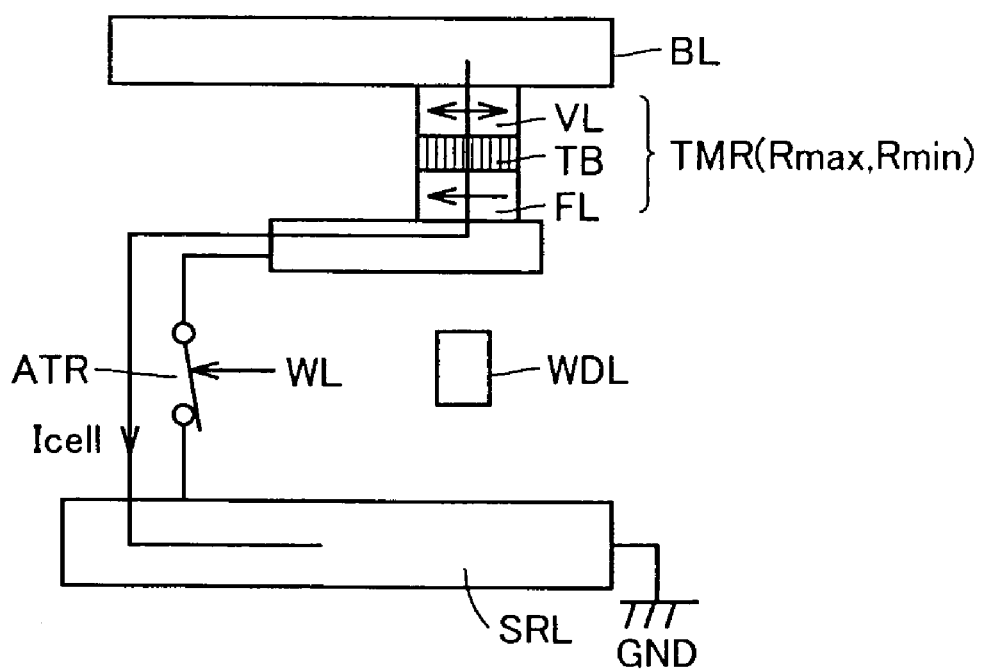
FIG. 19 is a conceptual diagram illustrating data read operation from the MTJ memory cell.

FIG. 15 is a circuit diagram illustrating how a bit write current is supplied in the structure of the third embodiment.

FIG. 15 exemplarily shows the case where write data DIN(1)=DIN(2)=L level ("0") and /DIN(3)=H level ("1") are written to the selected memory block MB1. In this case, a bit line write current −Iw must be supplied to the selected bit lines in sub blocks SB11, SB12. A bit line current +Iw must be supplied to the selected bit line in sub block SB13.

Since write data DIN(1) is L-level data, transistor switch 112 is turned ON and transistor switch 111 is turned OFF. Moreover, since write data DIN(3) is H-level data, transistor switch 121 is turned OFF and transistor switch 122 is turned ON.

Since write data DIN(1) and DIN(2) to adjacent sub blocks SB11 and SB12 have the same level, transistor switches 153, 156 in current direction regulating circuits 150 between sub blocks SB11 and SB12 are turned ON. Moreover, since write data DIN(1) and DIN(2) are L-level data, transistor switches 152, 154 are turned ON and transistor switches 151, 155 are turned OFF.

Since write data DIN(2) and DIN(3) to adjacent sub blocks SB12 and SB13 have different levels, transistor switches 153, 156 in current direction regulating circuits 150 between sub blocks SB12 and SB13 are turned OFF. Moreover, since write data DIN(2) is L-level data and write data DIN(3) is H-level data, transistor switches 154, 155 are turned ON and transistor switches 151, 152 are turned OFF.

As a result, a bit line write current ±Iw according to write data DIN(1) to DIN(3) can be supplied to the current path formed by power supply voltage Vcc, write current control line /WCL11, selected bit line in sub block SB11, write current control line WCL11, write current control line /WCL12, selected bit line in sub block SB12, write current control line WCL12, write current control line WCL13, selected bit line in sub block SB13, write current control line /WCL13 and ground voltage GND.

As described above, current direction regulating circuits 150 are capable of turning back a bit line write current as necessary for transmission to the following sub block, and selected bit lines in a plurality of sub blocks of the selected memory block can be connected in series between power supply voltage Vcc and ground voltage GND. Accordingly, a bit line write current can be supplied to a plurality of selected bit lines through a single current path in the directions according to the respective bits of write data DIN to be written in parallel.

According to the above structure of the third embodiment, data of a plurality of bits can be written in parallel without increasing current consumption by using the simple write drivers of the second embodiment. This enables reduction in area and power consumption of the MRAM device.

Note that the example of writing 3-bit data in parallel is described in the third embodiment. However, the present invention is not limited to this. Write data of any number of bits can be written in parallel by determining the number of sub blocks SB of each memory block MB according to the number of bits of write data DIN and providing current direction regulating circuits 150 between adjacent sub blocks.

In the second and third embodiments, a selected bit line is driven with power supply voltage Vcc and ground voltage GND in order to supply a bit line write current ±Iw thereto. However, the selected bit line may be driven with other voltage levels.

Each transistor switch included in the elements such as write drivers may either be an NMOS transistor or a PMOS transistor in view of the polarity of a signal applied to the gate thereof.

Although the present invention has been described and illustrated in detail, it is clearly understood that the same is by way of illustration and example only and is not to be taken by way of limitation, the sprit and scope of the present invention being limited only by the terms of the appended claims.

What is claimed is:

1. A thin film magnetic memory device, comprising:
a memory array having a plurality of memory cells arranged in a matrix, each memory cell having an electric resistance that varies according to storage data magnetically written there, said memory array being divided into a plurality of memory blocks along a direction of the memory cell rows; and
a plurality of write digit lines arranged respectively corresponding to said plurality of memory cell rows, for passing therethrough a prescribed write current of a fixed direction in a selected row in data write operation;
a plurality of bit lines arranged respectively corresponding to the plurality of memory cell columns, wherein in each memory cell column, said bit line is divided by said plurality of memory blocks, said thin film magnetic memory device further comprising:
a plurality of column selection lines arranged respectively corresponding to said plurality of memory cell columns, for transmitting a column selection result, each column selection line being provided to extend along a direction of the memory cell columns and shared by said plurality of memory blocks; and
a plurality of write drivers provided respectively corresponding to said plurality of bit lines in regions adjacent to each of said memory blocks in the direction of the memory cell columns, each write driver operating in response to activation of a corresponding one of said plurality of column selection lines to supply a data write current of a direction corresponding to a level of write data to a corresponding one of said plurality of bit lines.

* * * * *